(12) United States Patent
Tu et al.

(10) Patent No.: US 12,471,329 B2
(45) Date of Patent: Nov. 11, 2025

(54) SEMICONDUCTOR STRUCTURES AND MANUFACTURING METHOD THEREOF

(71) Applicant: TAIWAN SEMICONDUCTOR MANUFACTURING COMPANY LTD., Hsinchu (TW)

(72) Inventors: Shih-Jung Tu, Tainan (TW); Po-Wei Liu, Tainan (TW); Tsung-Yu Yang, Tainan (TW); Yun-Chi Wu, Tainan (TW); Chien Hung Liu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 497 days.

(21) Appl. No.: 18/153,335

(22) Filed: Jan. 11, 2023

(65) Prior Publication Data
US 2024/0096941 A1  Mar. 21, 2024

Related U.S. Application Data

(60) Provisional application No. 63/375,873, filed on Sep. 16, 2022.

(51) Int. Cl.
| | |
|---|---|
| *H01L 21/76* | (2006.01) |
| *H01L 21/762* | (2006.01) |
| *H01L 23/52* | (2006.01) |
| *H01L 23/522* | (2006.01) |
| *H10D 62/10* | (2025.01) |

(52) U.S. Cl.
CPC ..... *H10D 62/115* (2025.01); *H01L 21/76224* (2013.01); *H01L 23/5226* (2013.01)

(58) Field of Classification Search
CPC ............ H10D 62/115; H01L 21/76224; H01L 23/5226; H01L 21/76898
USPC ......................................................... 257/506
See application file for complete search history.

(56) References Cited

U.S. PATENT DOCUMENTS 10,643,927 B1 *  5/2020  Shank ................... H01L 23/481

* cited by examiner

*Primary Examiner* — Monica D Harrison
(74) *Attorney, Agent, or Firm* — WPAT LAW; Anthony King

(57) ABSTRACT

A semiconductor structure includes a substrate with a first surface and a second surface opposite to the first surface, a first and a second shallow trench isolations disposed in the substrate and on the second surface, a deep trench isolation structure in the substrate and coupled to the first shallow trench isolation, a first dielectric layer disposed on the first surface and coupled to the deep trench isolation structure, a second dielectric layer disposed over the first dielectric layer and coupled to the deep trench isolation structure, a third dielectric layer comprising a horizontal portion disposed over the second dielectric layer and a vertical portion coupled to the horizontal portion, and a through substrate via structure penetrating the substrate from the first surface to the second surface and penetrating the second shallow trench isolation.

20 Claims, 34 Drawing Sheets

SEMICONDUCTOR STRUCTURES AND MANUFACTURING METHOD THEREOF

PRIORITY CLAIM AND CROSS-REFERENCE

This application claims the benefit of prior-filed provisional application No. 63/375,873, filed on Sep. 16, 2022.

BACKGROUND

The semiconductor integrated circuit (IC) industry has experienced rapid growth. Technological advances in IC materials and design have produced continuous improvements in generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, as the feature sizes continue to decrease, fabrication processes continue to become more difficult to perform. Thus, there is a challenge to form reliable semiconductor devices with smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
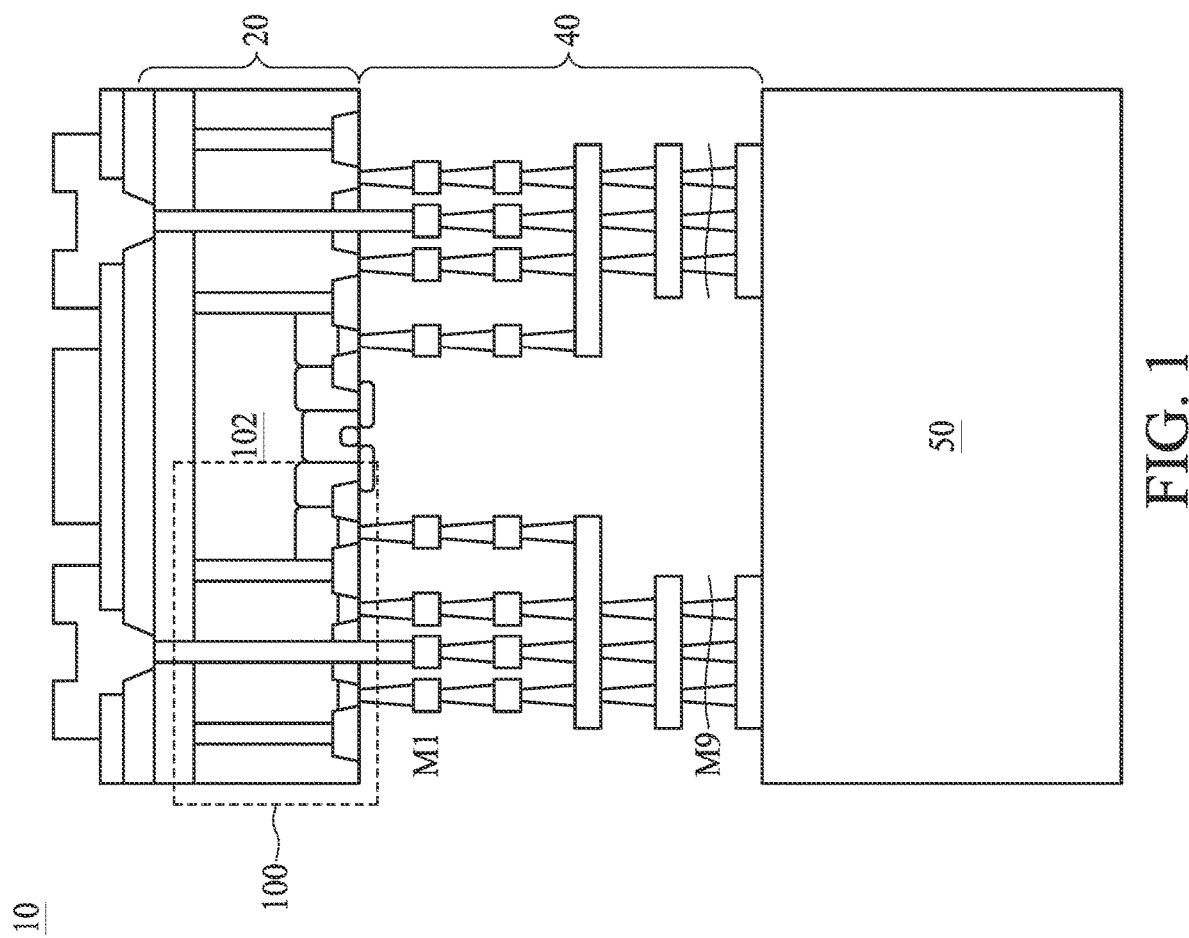
FIG. 1 illustrates a fragmentary cross-sectional view of an IC device.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In the present disclosure, a phrase "one of A, B and C" means "A, B and/or C" (A, B, C, A and B, A and C, B and C, or A, B and C), and does not mean one element from A, one element from B and one element from C, unless otherwise described.

As used herein, although terms such as "first," "second" and "third" describe various elements, components, regions, layers and/or sections, these elements, components, regions, layers and/or sections are not limited by these terms. These terms are used to distinguish one element, component, region, layer, or section from another. Terms such as "first," "second" and "third" in response to used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that is contemplated by people having ordinary skill in the art. Alternatively, the terms "substantially," "approximately" and "about" mean within an acceptable standard error of the mean in response to considered by one of ordinary skill in the art. People having ordinary skill in the art understand that the acceptable standard error varies according to different technologies. Other than in the operating/working examples, or unless otherwise expressly specified, the numerical ranges, amounts, values, and percentages such as those for quantities of materials, durations of times, temperatures, operating conditions, ratios of amounts, and the likes thereof disclosed herein should be understood as modified in instances by the terms "substantially," "approximately" or "about." Accordingly, unless indicated to the contrary, the numerical parameters set forth in the present disclosure and attached claims are approximations that vary as desired. At the very least, each numerical parameter is construed considering the number of reported significant digits and by applying ordinary rounding techniques. Ranges are expressed herein as from one endpoint to another endpoint or between two endpoints. All ranges disclosed herein are inclusive of the endpoints, unless otherwise specified.

An IC manufacturing process flow can be divided into three categories: front-end-of-line (FEOL), middle-end-of-line (MEOL) and back-end-of-line (BEOL) processes. FEOL generally encompasses processes related to fabrication of IC devices, such as transistors. For example, FEOL processes can include forming isolation structures for isolating IC devices, gate structures, and source and drain structures (also referred to as source/drain structures) that form a transistor. MEOL generally encompasses processes related to fabrication of IC devices (also referred to as contacts or plugs) that connect to conductive structures (or conductive regions) of the IC devices. For example, MEOL processes can include forming connecting structures that connect to the gate structures and connecting structures that connect to the source/drain structures. BEOL generally encompasses processes related to fabrication of multilayer interconnect (MLI) structures that electrically connect the IC devices and the connecting structures fabricated by FEOL and MEOL processes. Accordingly, operation of the IC devices can be enabled. The manufactured IC devices are then been use for various application, for example, can be integrated into a wafer-on-wafer (WOW) packing process.

As mentioned above, the scaling down processes have increased the complexity of processing and manufacturing of ICs. As the feature sizes continue decreasing, fabrication processes continue to become more difficult and more costs to perform. Thus, there is a challenge to form reliable semiconductor devices with smaller and smaller sizes within the budget. A method and semiconductor structures are hence provided to save masks and processes as to reduce the costs. For example, to form a back side deep trench isolation (BSDTI) structure and a back side through substrate via (BTSV) structure at the same step by using one mask. The BSDTI structure is required and well known for contact image sensor (CIS) products process. The BTSV structure is a common technology used in WOW semiconductor package, and the process of BTSV is similar to BSDTI. Compare to a front side deep trench isolation (FSDTI) process, the process of BSDTI structure has less thermal budget and lower cost. Also, a high-k (HK) film was formed in a WOW process for substrate leakage reduction, and the HK film can replace a silicon on insulator (SOI) buried oxide (BOX) as an isolation layer. And the process steps of the HK film in the deep trench or in the through substrate via can be optimized to reduce the substrate leakage.

The present disclosure therefore provides semiconductor structures and methods for forming the same. In some embodiments, the HK film is used to form in the deep trench or in the through substrate via, such that the substrate leakage of the semiconductor structure can be mitigated. In some embodiments, the semiconductor structure including the HK film can be formed in the back side substrate. In some embodiments, the semiconductor structure including the HK film can be the isolation layer to reduce the substrate leakage. In other embodiments, the semiconductor structure including the HK film can be used in a bipolar-complementary metal oxide semiconductor-double-diffused metal oxide semiconductor (Bipolar-CMOS-DMOS; BCD) device to lower the substrate leakage. In such embodiments, the semiconductor structure including the HK film can keep the original logic and the BCD performance without any penalty. In some embodiments, the process steps of the HK film in the deep trench or in the through substrate via can be easily integrated into the WOW process.

FIG. 1 is a fragmentary cross-sectional view of an IC device 10. In some embodiments, an IC manufacturing process flow can be divided into three categories: front-end-of-line (FEOL), middle-end-of-line (MEOL) (not shown) and back-end-of-line (BEOL). FEOL generally encompasses processes related to fabrication of IC devices, such as transistors. For example, FEOL processes can include formation of isolation structures for isolating IC devices, gate structures, and source and drain structures (also referred to as source/drain structures) that form a transistor. In some embodiments, the devices formed by the FEOL processes can be referred to as FEOL devices 20. MEOL (not shown) generally encompasses processes related to fabrication of connecting structures (also referred to as contacts or plugs) that connect to conductive structures (or conductive regions) of the IC devices. BEOL generally encompasses processes related to fabrication of multilayer interconnect (MLI) structures that electrically connect the IC devices to the connecting structures fabricated by FEOL and MEOL. In some embodiments, the MLI structures formed by the BEOL processes can be referred to as BEOL structures 40. Accordingly, the IC device 10 can be constructed by the FEOL devices 20, the MEOL structures and the BEOL structures 40, and operation of the IC devices can be enabled. In some embodiments, the IC device 10 is bonded to a carrier wafer 50. In some embodiments, a semiconductor structure 100 including the HK film is formed in the back side substrate 102 of the FEOL devices 20.

Figure 2:
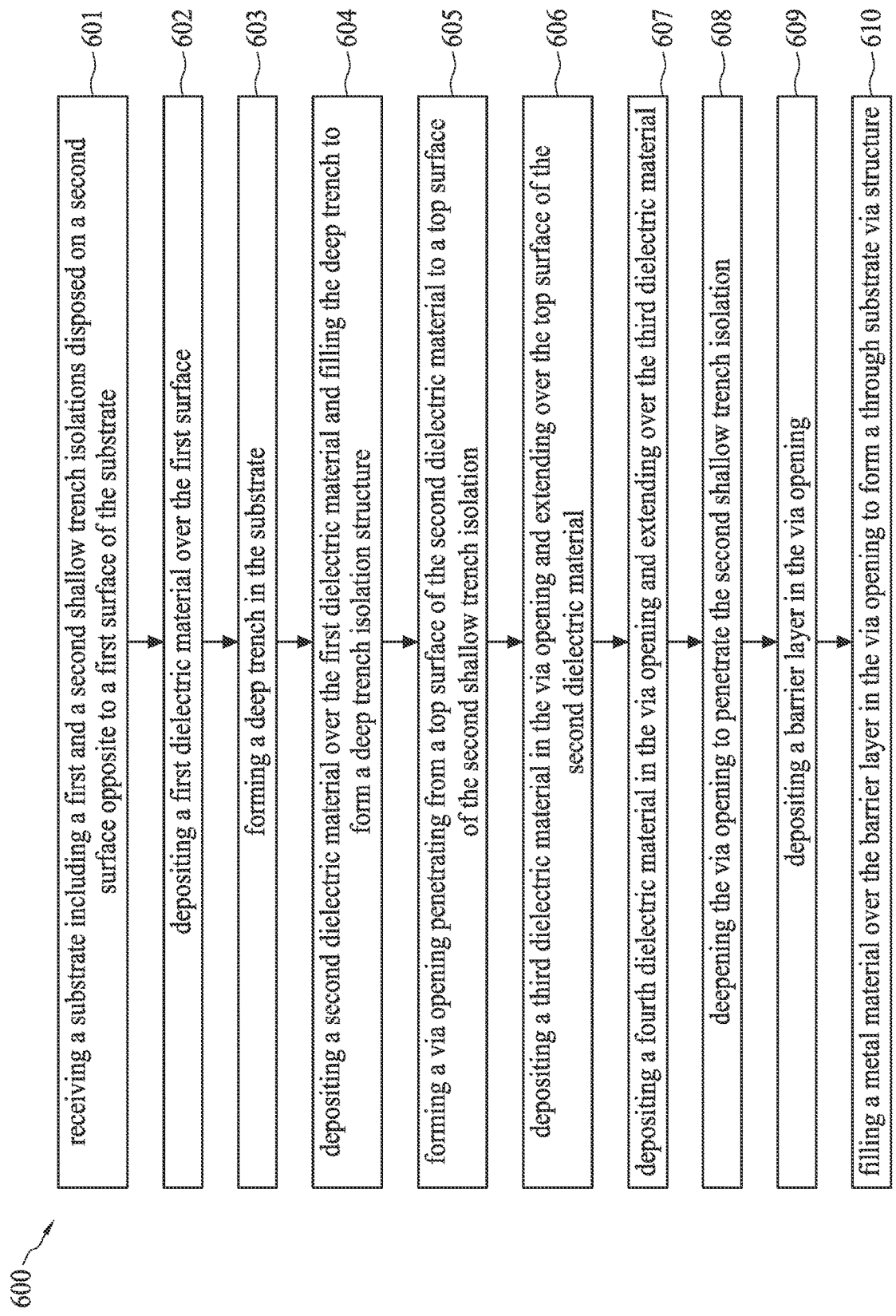
FIG. 2 is a flowchart of a method for forming a semiconductor structure according to some embodiments of the present disclosure.

FIG. 2 is a flowchart representing a method 600 for forming the semiconductor structure 100 according to some embodiments of the present disclosure. The method 600 includes a number of operations (601, 602, and 603 to 610). The method 600 will be further described according to one or more embodiments. It should be noted that the operations of the method 600 may be rearranged or otherwise modified within the scope of the various aspects. It should further be noted that additional processes may be provided before, during, and after the method 600, and that some other processes may be briefly described herein. Thus, other implementations are possible within the scope of the various aspects described herein.

Figure 3A:
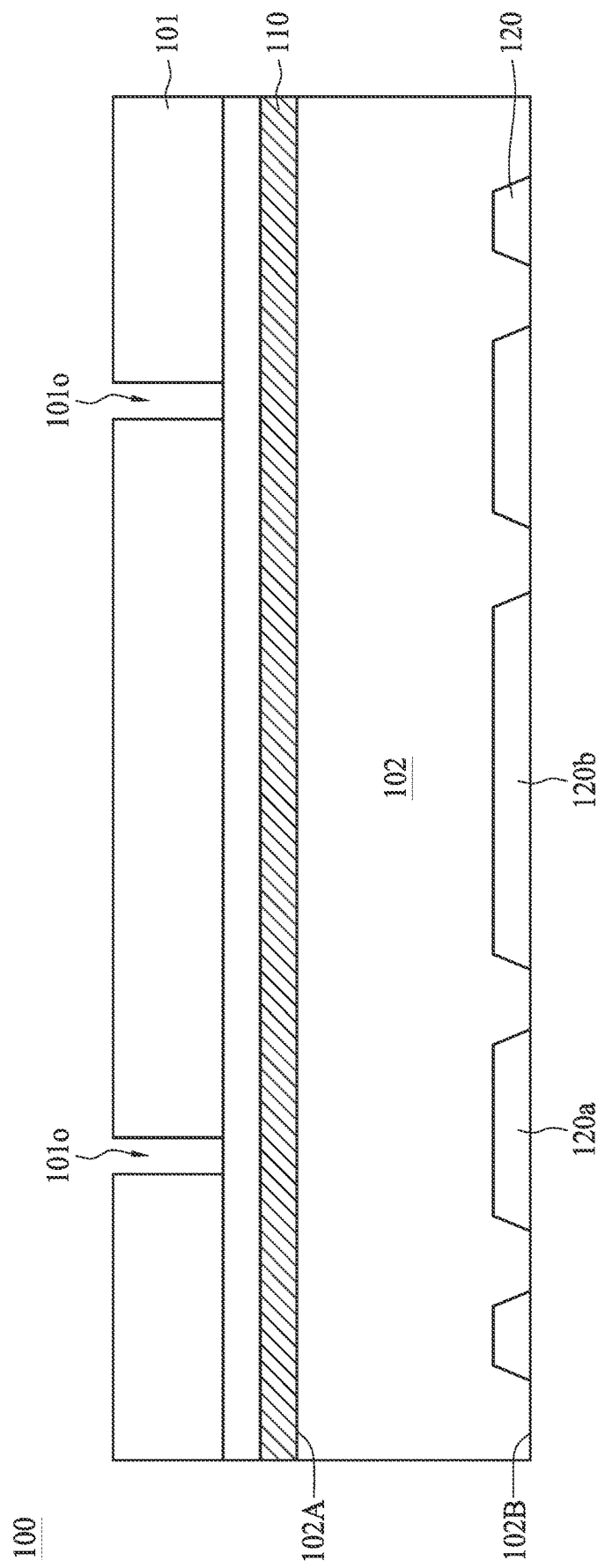
FIGS. 3A to 3G illustrate schematic drawings respectively of intermediate stages in the manufacturing of the semiconductor structure, in accordance with some embodiments.
Figure 3B:
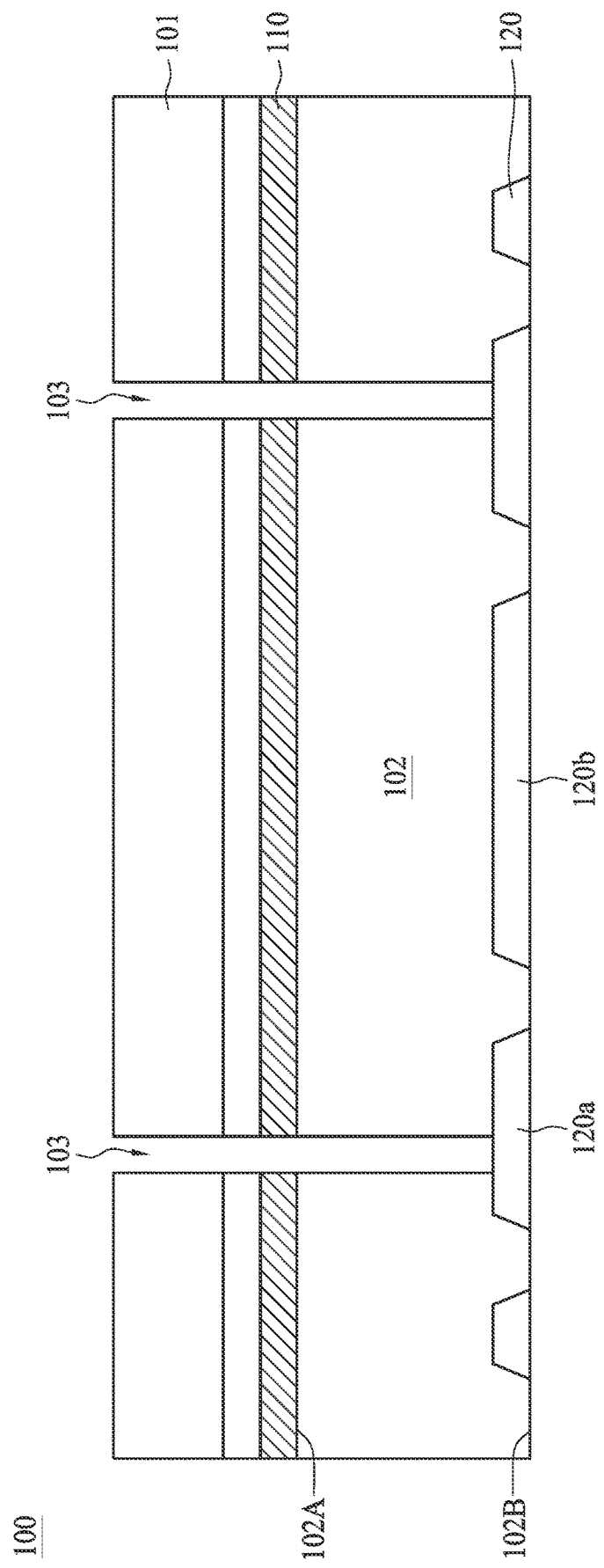
Figure 3C:
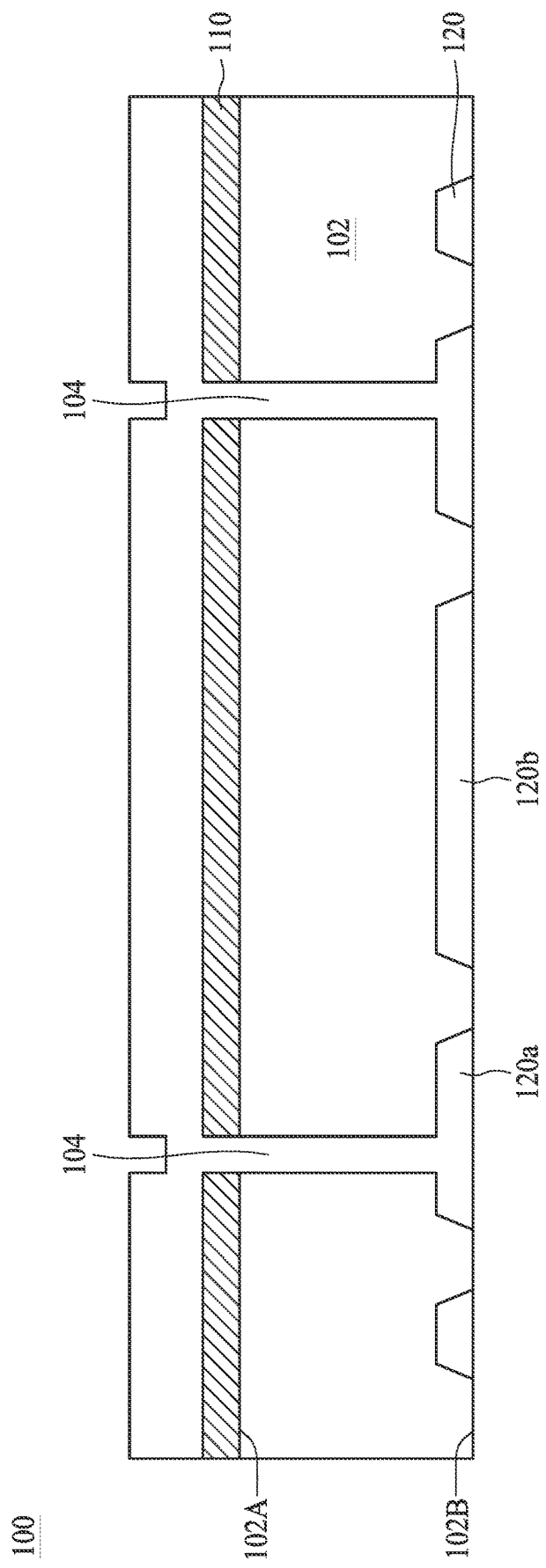
Figure 3D:
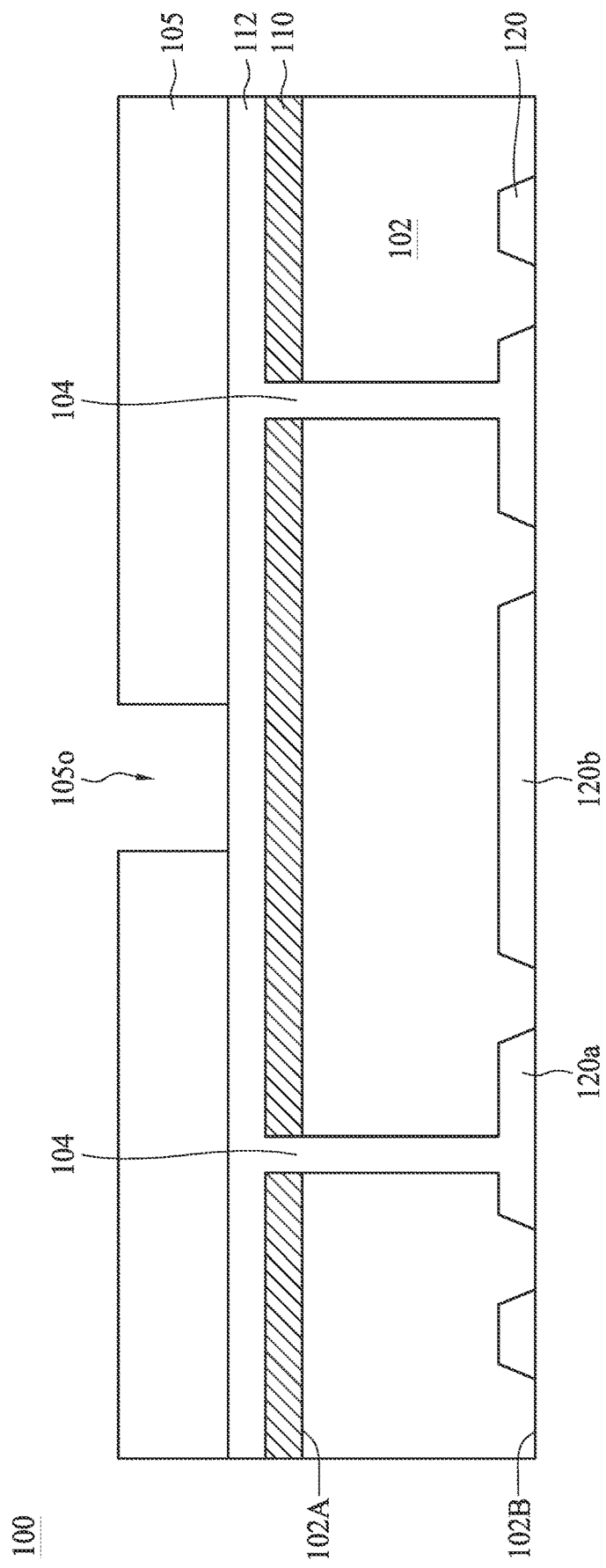
Figure 3E:
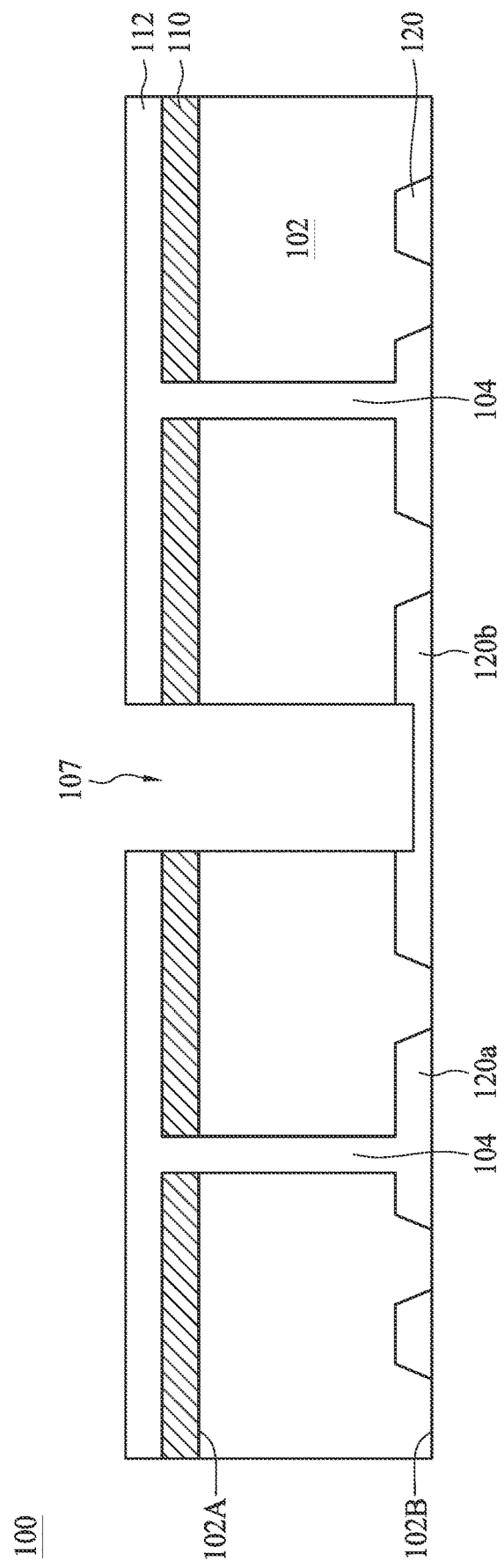
Figure 3F:
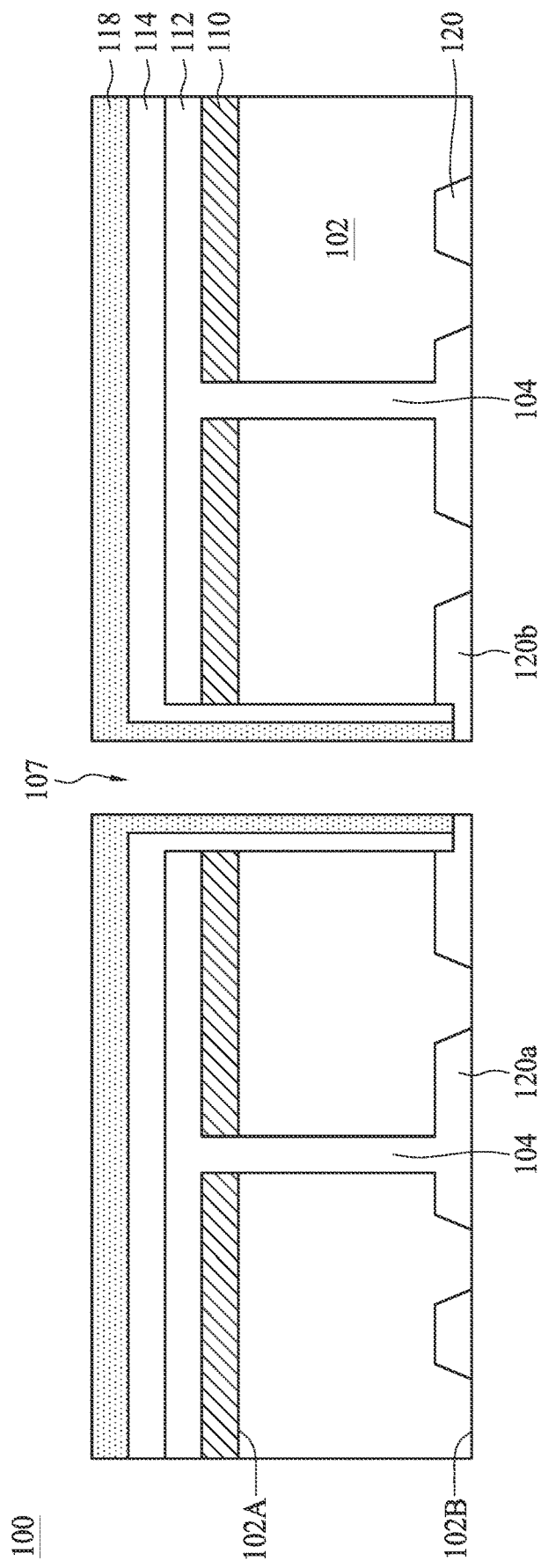
Figure 3G:
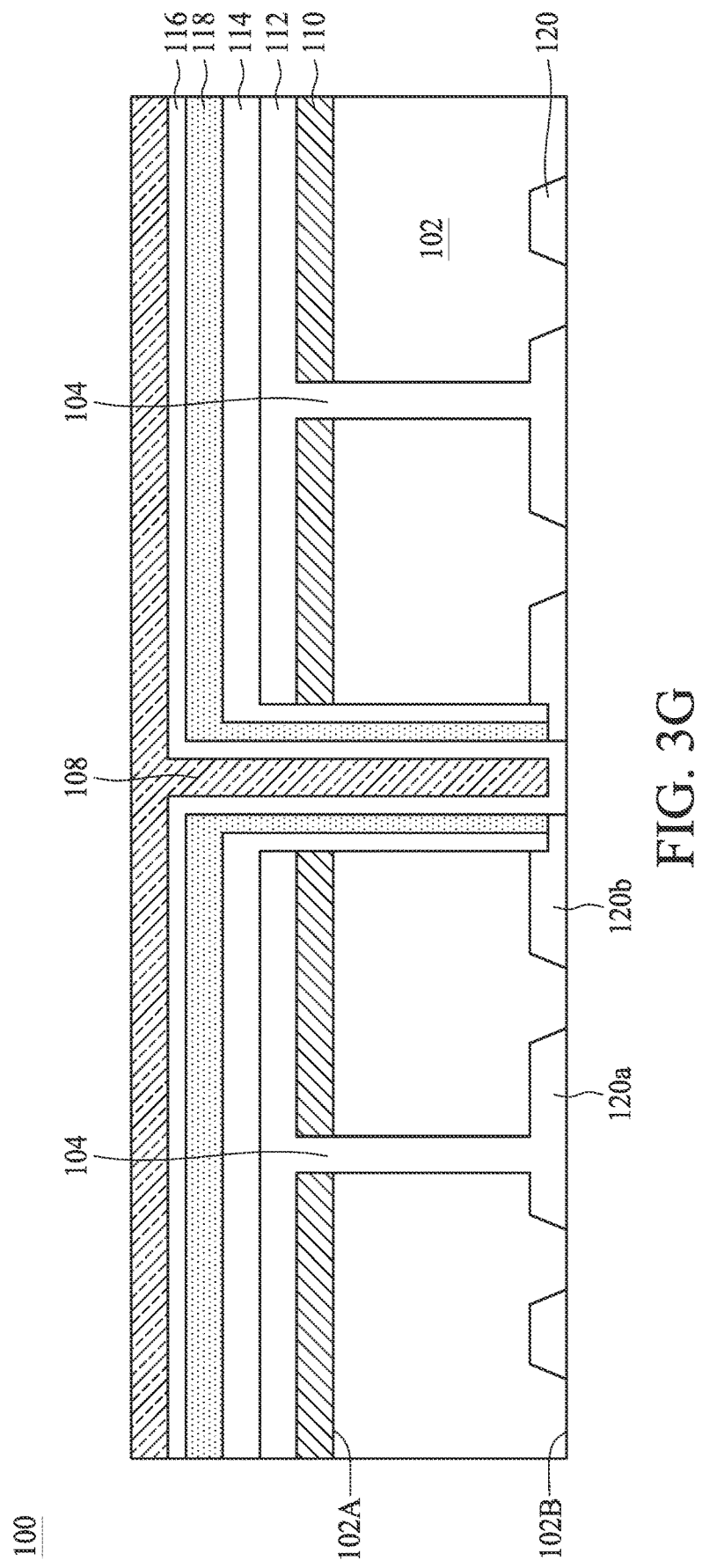
Figure 3H:
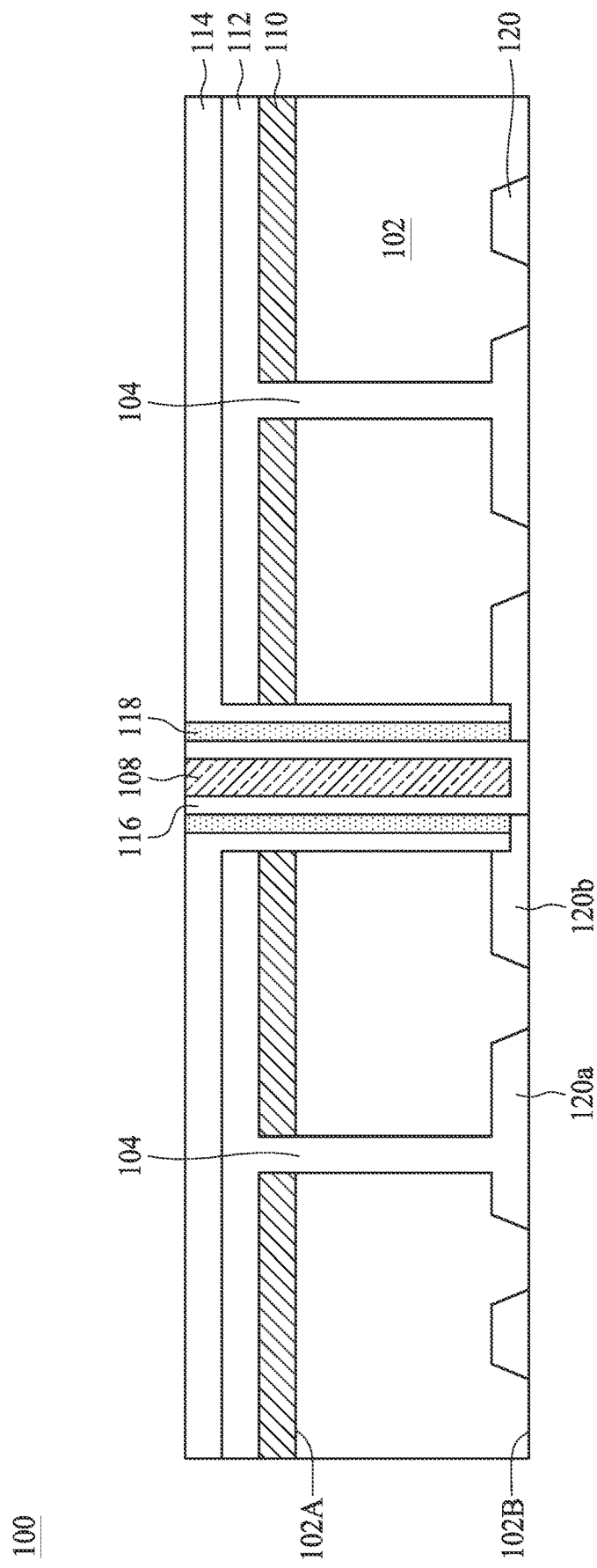
FIG. 3H illustrates a schematic drawing of the semiconductor structure according to some embodiments of the present disclosure.

Referring to FIGS. 3A to 3H, which are schematic drawings illustrating a semiconductor structure 100 at various fabrication stages according to aspects of the present disclosure in one or more embodiments. FIGS. 3A to 3G illustrate schematic drawings respectively of intermediate stages in the manufacturing of the semiconductor structure 100, in accordance with some embodiments. FIG. 3H illustrates a schematic drawing of the semiconductor structure 100 according to some embodiments. It should be noted that same elements in FIGS. 3A to 3H are indicated by the same numerals, and may include a same material. In some embodiments, the semiconductor structure 100 can be provided as shown in FIGS. 3A to 3H.

Referring to FIG. 3A, in operation 601, a substrate 102 is received. The substrate 102 includes a first surface 102A and a second surface 102B opposite to the first surface 102A. The substrate 102 may be a semiconductor substrate, such as a bulk semiconductor, a silicon-on-insulator (SOI) substrate, or the like, which may be doped (e.g., with a p-type or an n-type dopant) or undoped. The substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 102 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

As shown in FIG. 3A, the substrate 102 includes a plurality of shallow trench isolations (STIs) 120 (such as a first shallow trench isolation 120a and a second shallow trench isolation 120b) formed over the second surface 102B to electrically isolate various regions, such as various device regions, of the semiconductor structure. For example, the isolations can define and electrically isolate active device regions and/or passive device regions from each other. The isolations can include silicon oxide, silicon nitride, silicon oxynitride, a low-k material, another suitable isolation material, or combinations thereof.

Still referring to FIG. 3A, in operation 602, a first dielectric material is deposited over the first surface 102A of the substrate 102, where the first dielectric material is a high-k dielectric material. The high-k dielectric material generally refers to dielectric materials having a high dielectric constant, for example, a dielectric constant greater than that of silicon oxide (k≈3.9). Exemplary high-k dielectric materials for example, $HfO_2$, HfSiO, HfSiON, HfTaO, HfSiO, HfZrO, $ZrO_2$, $Al_2O_3$, $HfO_2$—$Al_2O_3$, $TiO_2$, $Ta_2O_5$, $La_2O_3$, $Y_2O_3$, another suitable high-k dielectric material, or combinations thereof. The high-k dielectric material formed over the first surface 102A of the substrate 102 is referred as to a first dielectric layer 110 (HK film). In FIG. 3A, an oxide material is deposited over the first dielectric layer 110. The oxide material may include silicon oxide, but the disclosure is not limited thereto.

Referring to FIG. 3B, in operation 603, a deep trench 103 is formed in the substrate 102, where the deep trench 103 is formed by forming a first hard mask structure 101 over the first surface 102A of substrate 102, patterning the first hard mask structure 101 to form an opening 101o (as shown in FIG. 3A) in the first hard mask structure 101, and etching the substrate 102 through the opening 101o to form the deep trench 103, as shown in FIG. 3B, in accordance with some embodiments. The etching process stops over the first shallow trench isolation 120a. The first shallow trench isolation 120a is exposed from a bottom of the deep trench 103. After the deep trench 103 is formed, the first hard mask structure 101 is removed.

Referring to FIG. 3C, in operation 604, a second dielectric material is deposited over the first dielectric layer 110 and in the deep trench 103. The deep trench 103 is filled with the second dielectric material to form a deep trench isolation structure 104. The second dielectric material may include silicon oxide, but the disclosure is not limited thereto.

In some embodiments, the second dielectric material is formed by any suitable deposition. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure chemical vapor deposition (LPCVD) process, thermal oxidation, UV-ozone oxidation, epitaxial growth methods (e.g., selective epitaxy growth), sputtering, plating, spin-on coating, other suitable methods, and/or combinations thereof.

A planarization process such as a chemical-mechanical polishing or planarization (CMP) process is then performed to remove a portion of the second dielectric material formed over the top surface of the first dielectric layer 110, leaving a second dielectric layer 112 over the first dielectric layer 110 and a flat and even surface of the second dielectric layer 112 is obtained, as shown in FIG. 3D, in accordance with some embodiments.

Referring to FIG. 3E, in operation 605, a via opening 107 is formed penetrating from a top surface of the second dielectric layer 112 to a top surface of the second shallow trench isolation 120b. In FIG. 3E, in some embodiments, the via opening 107 is formed by forming a second hard mask structure 105 over the first surface 102A of substrate 102, patterning the second hard mask structure 105 to form an opening 105o (as shown in FIG. 3D) in the second hard mask structure 105, and etching substrate 102 through the opening 105o. The etching process stops over the second shallow trench isolation 120b. The second shallow trench isolation 120b is exposed from a bottom of the via opening 107. After the via opening 107 is formed, the second hard mask structure 105 is removed, as shown in FIG. 3E, in accordance with some embodiments.

Referring to FIG. 3F, in operation 606, a third dielectric material is deposited in the via opening 107 and extending over the top surface of the second dielectric layer 112, and in operation 607, a fourth dielectric material is deposited over the third dielectric material. The third and fourth dielectric material are conformally formed in the via opening 107 and over the second dielectric layer 112. In some embodiments, the third dielectric material is similar to the second dielectric material. In some embodiments, the fourth dielectric material may include silicon nitride (SiN) and may be formed over the connection structure by a suitable method such as atomic layer deposition (ALD) and/or CVD.

Still referring to FIG. 3F, a portion of the third dielectric material and a portion of the fourth dielectric material are removed, such to form a third dielectric layer 114 over sidewalls of the via opening 107 and a fourth dielectric layer 118 over the third dielectric layer 114. In such embodiments, the second shallow trench isolation 120b is exposed through a bottom of the via opening 107. In some embodiments, in operation 608, the via opening 107 is deepened until the via opening 107 penetrating the second shallow trench isolation 120b. In such embodiments, the via opening 107 fully penetrates the substrate 102.

Referring to FIG. 3G, in operation 609, a barrier layer 116 is deposited in the via opening 107. The barrier layer 116 is conformally formed in the via opening 107 and covers a bottom and sidewalls of the via opening 107, as shown in FIG. 3G, in accordance with some embodiments. In some embodiments, the barrier layer 116 may include titanium, titanium nitride, tantalum, tantalum nitride, tungsten, cobalt, cobalt nitride, tungsten nitride, ruthenium, ruthenium nitride, other suitable metals, other suitable metal nitrides, or combinations thereof.

Still referring to FIG. 3G, in operation 610, a metal material (such as copper) is formed over the barrier layer 116 to fill the via opening 107. A planarization process such as a CMP process is then performed to remove the excess portions of the metal material, thereby forming a through-substrate-via structure 108, as shown in FIG. 3H.

Accordingly, a semiconductor structure 100 is obtained. FIG. 3H illustrates a schematic drawing of the semiconductor structure 100 according to some embodiments. In some embodiments, the semiconductor structure 100 includes a substrate 102, a first and second shallow trench isolations 120a and 120b, a deep trench isolation structure 104, a first dielectric layer 110, a second dielectric layer 112, a third dielectric layer 114 and a through substrate via structure 108. In some embodiments, the substrate 102 includes a first surface 102A and a second surface 102B opposite to the first surface 102A. In some embodiments, the first and second shallow trench isolations 120a and 120b are disposed in the substrate 102 and on the second surface 102B. In some embodiments, the deep trench isolation structure 104 is coupled to the first shallow trench isolation 120a. In some embodiments, the first dielectric layer 110 is disposed on the first surface 102A and coupled to the deep trench isolation structure 104. In some embodiments, the first dielectric layer 110 is a high-k dielectric material. In some embodiments, the second dielectric layer 112 is disposed over the first dielectric layer 110 and coupled to the deep trench isolation structure 104. In some embodiments, the third dielectric layer 114 includes a horizontal portion disposed over the second dielectric layer 112 and a vertical portion coupled to the horizontal portion. In some embodiments, the through substrate via structure 108 penetrates the substrate 102 from the first surface 102A to the second surface 102B and penetrates the second shallow trench isolation 120b. In some embodiments, the vertical portion of the third dielectric layer 114 surrounds the through substrate via structure 108.

In some embodiments, the semiconductor structure 100 also includes a barrier layer 116 and a fourth dielectric layer 118. In some embodiments, the barrier layer 116 is disposed between the through substrate via structure 108 and the vertical portion of the third dielectric layer 114. In some embodiments, the fourth dielectric layer 118 is disposed between the barrier layer 116 and the vertical portion of the third dielectric layer 114. In some embodiments, the fourth dielectric layer 118, the barrier layer 116 and the vertical portion of the third dielectric layer 114 are parallel to each other. In some embodiments, a top surface of the horizontal portion of the third dielectric layer 114, a top surface of the fourth dielectric layer 118, a top surface of the barrier layer 116, and a top surface of the through substrate via structure 108 are aligned with each other.

In some embodiments, a thickness of the first dielectric layer 110 including $HfO_2$ is within a range from about 50 angstroms to about 100 angstroms. In some embodiments, a thickness of the first dielectric layer 110 including $Ta_2O_5$ is within a range from about 500 angstroms to about 800 angstroms. In some embodiments, a width of the through substrate via structure 108 is within a range from about 3.0 micrometer to about 3.5 micrometer. In some embodiments, a width of the deep trench isolation structure 104 is within a range from about 0.6 micrometer to about 0.8 micrometer.

Figure 4A:
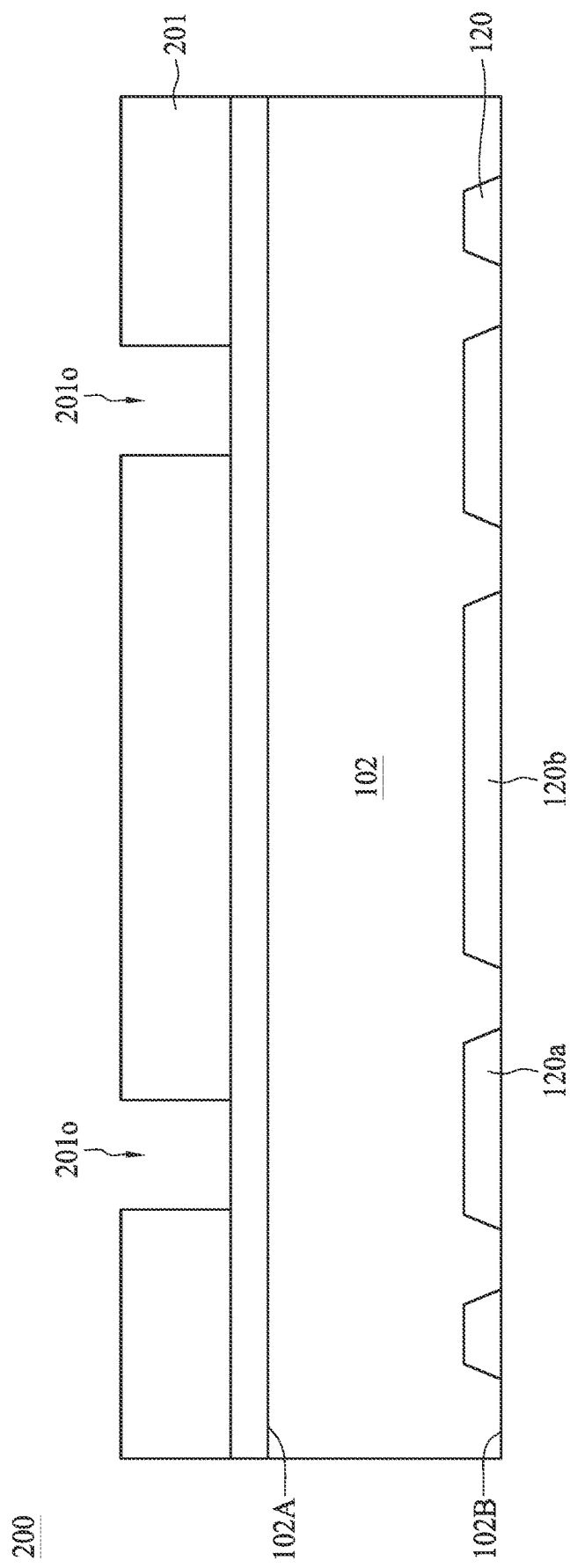
FIGS. 4A to 4I illustrate schematic drawings respectively of intermediate stages in the manufacturing of the semiconductor structure, in accordance with some embodiments.
Figure 4B:
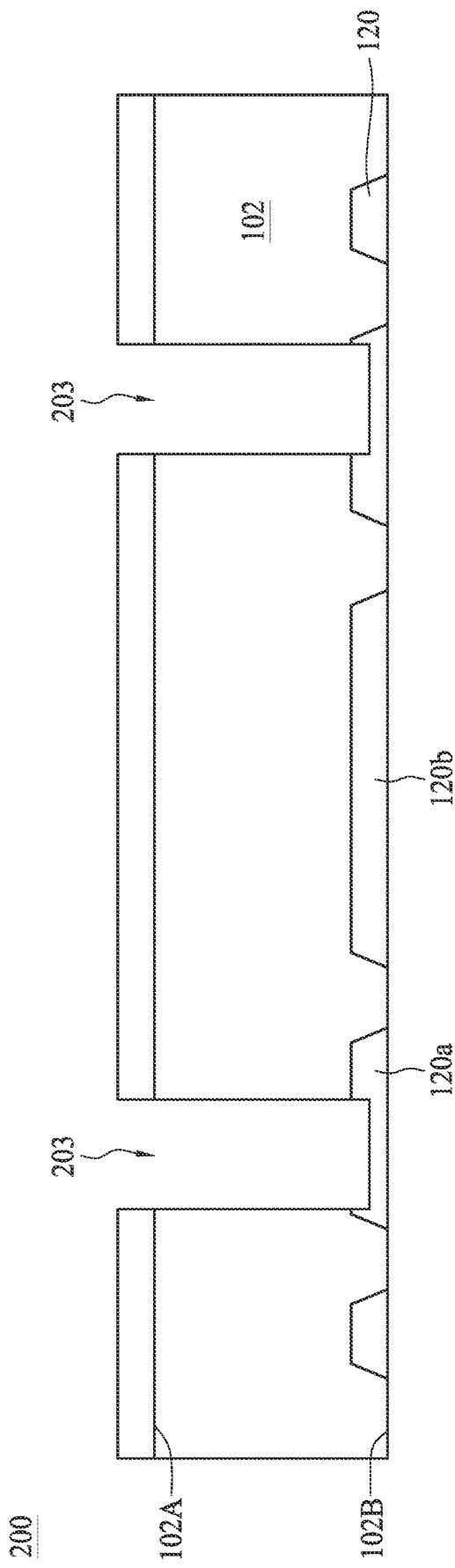
Figure 4C:
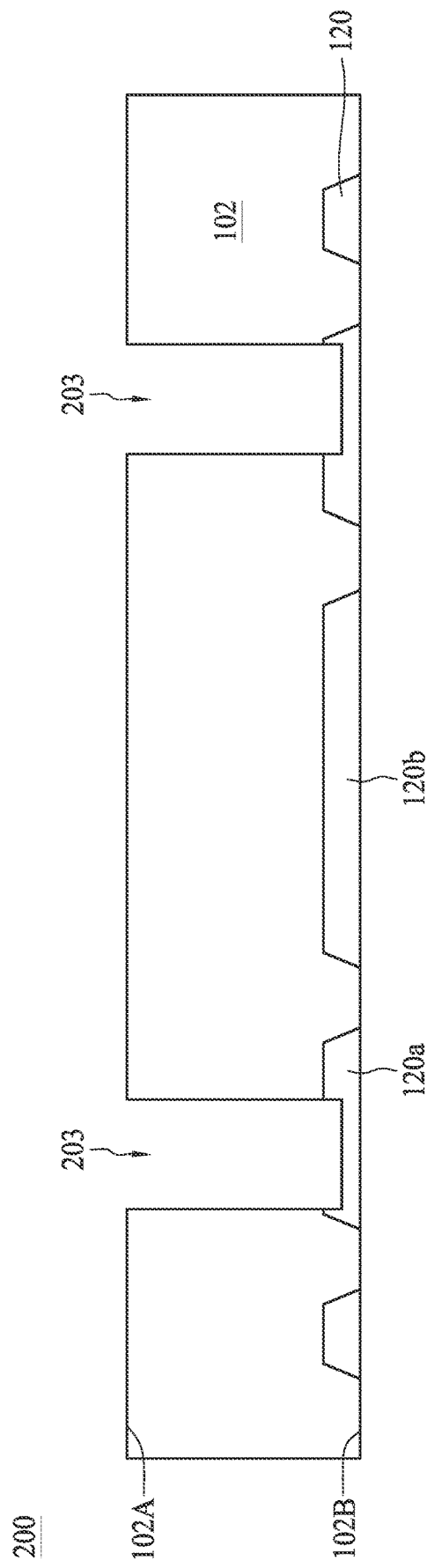
Figure 4D:
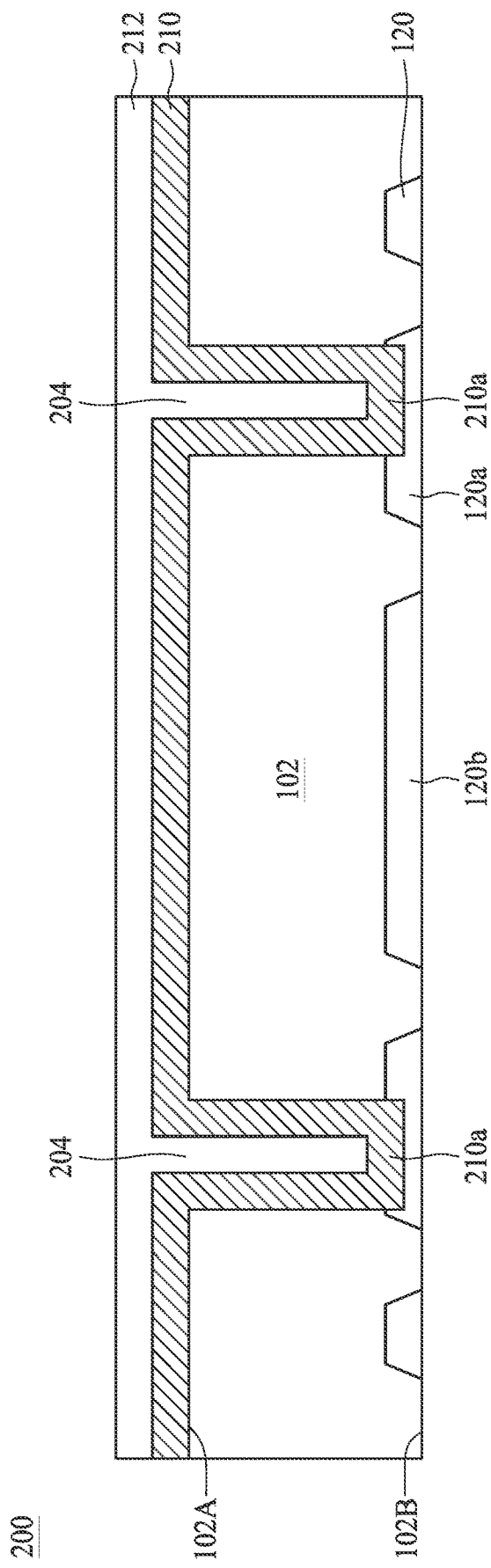
Figure 4E:
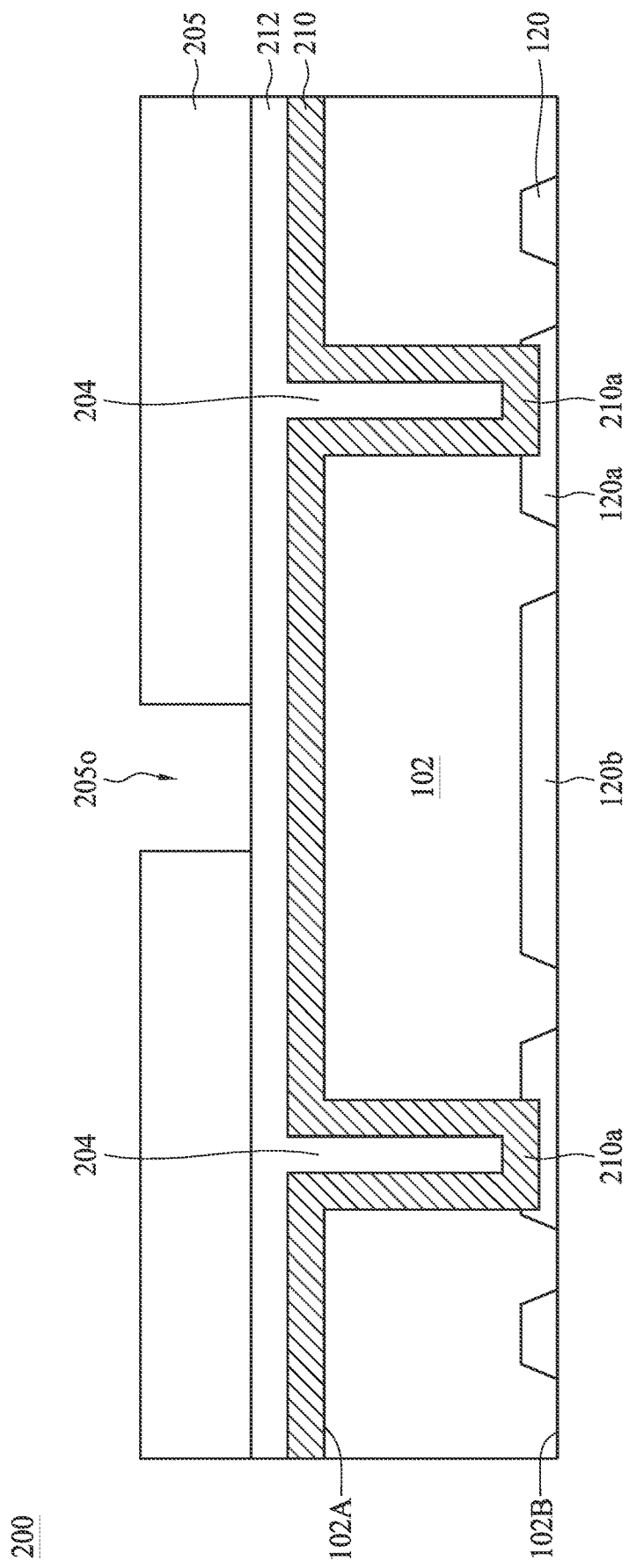
Figure 4F:
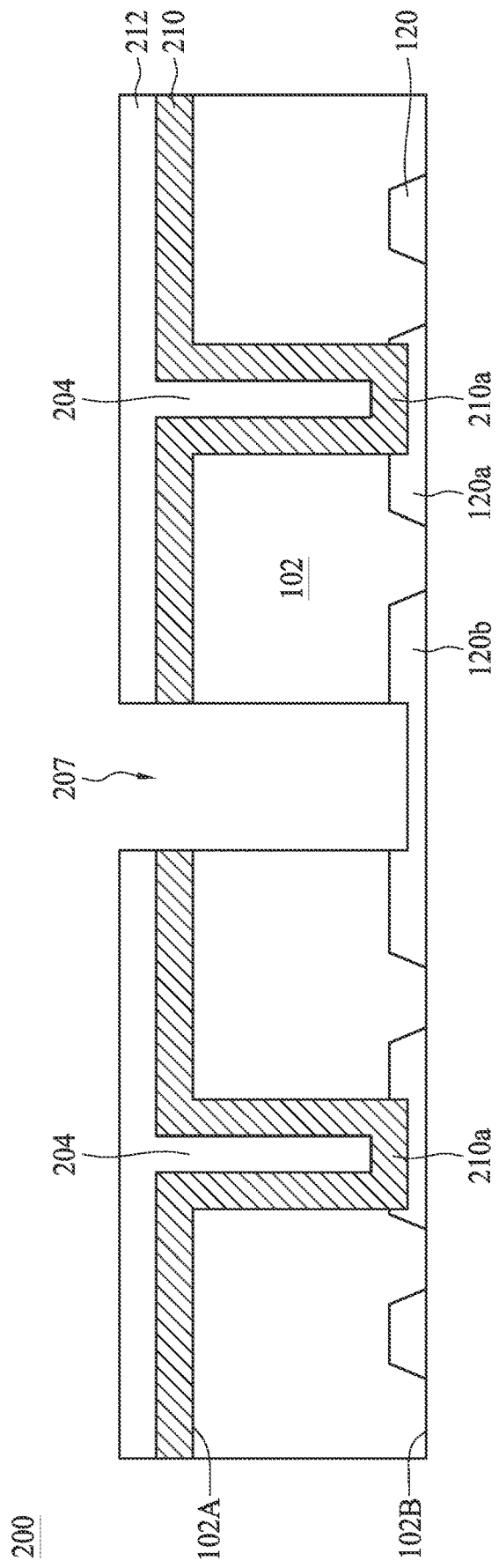
Figure 4G:
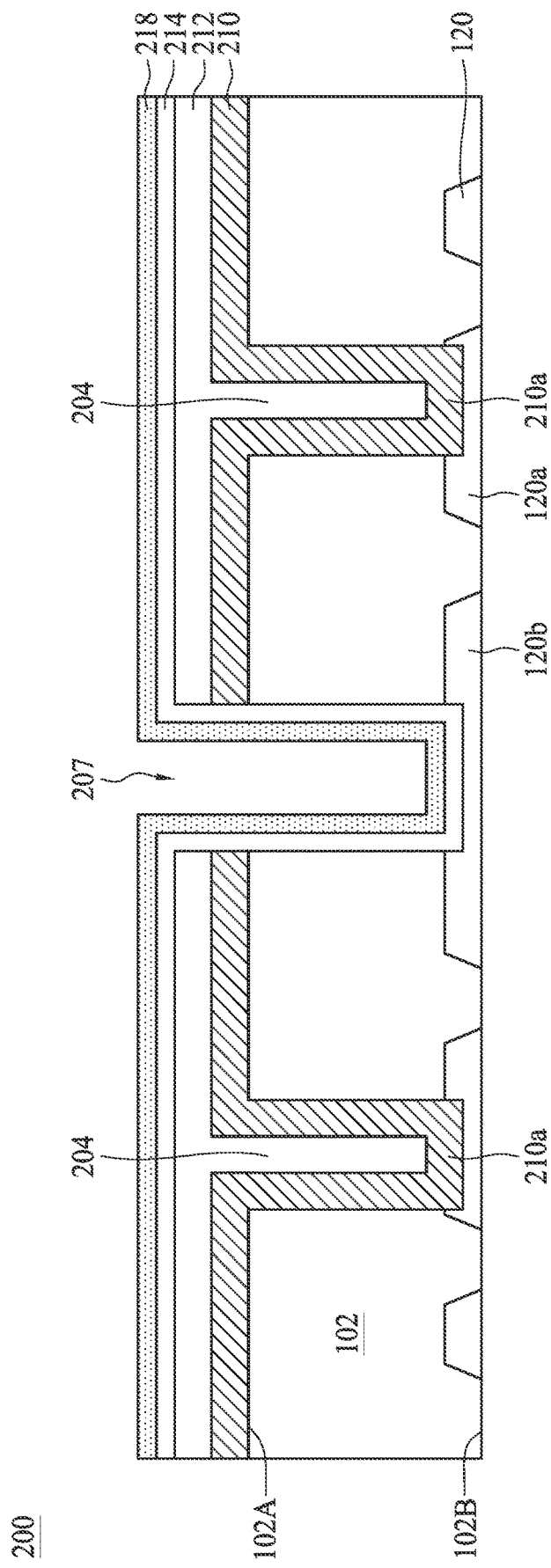
Figure 4H:
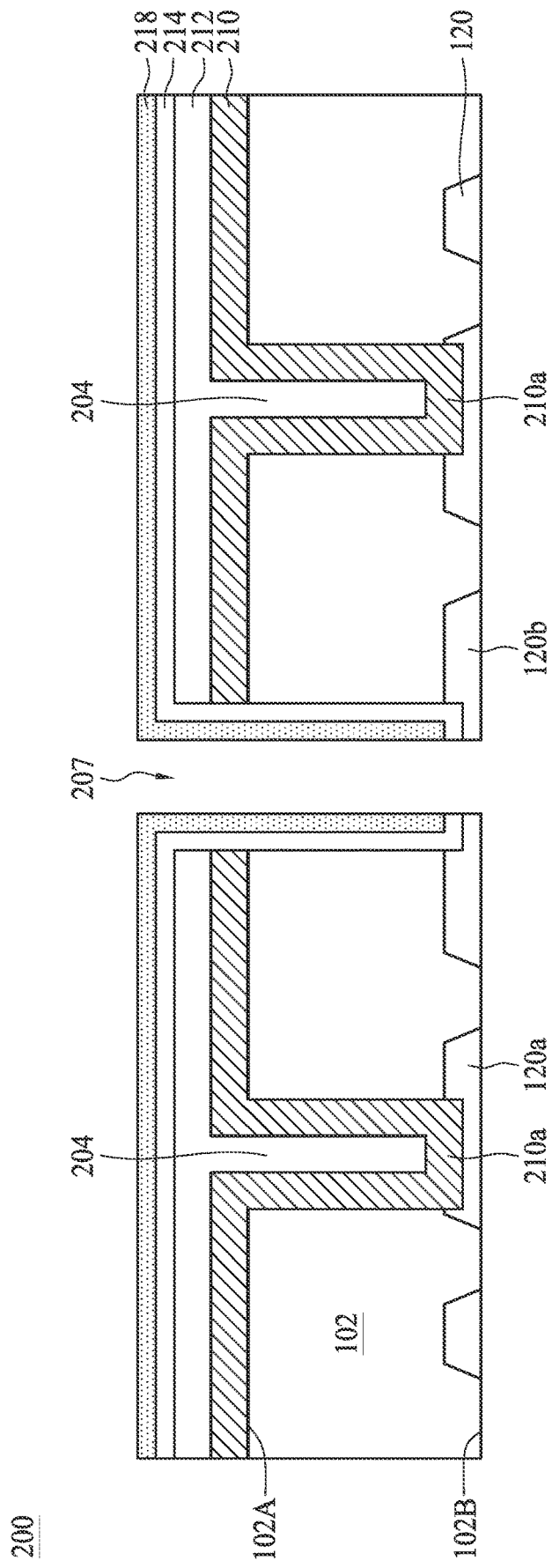
Figure 4I:
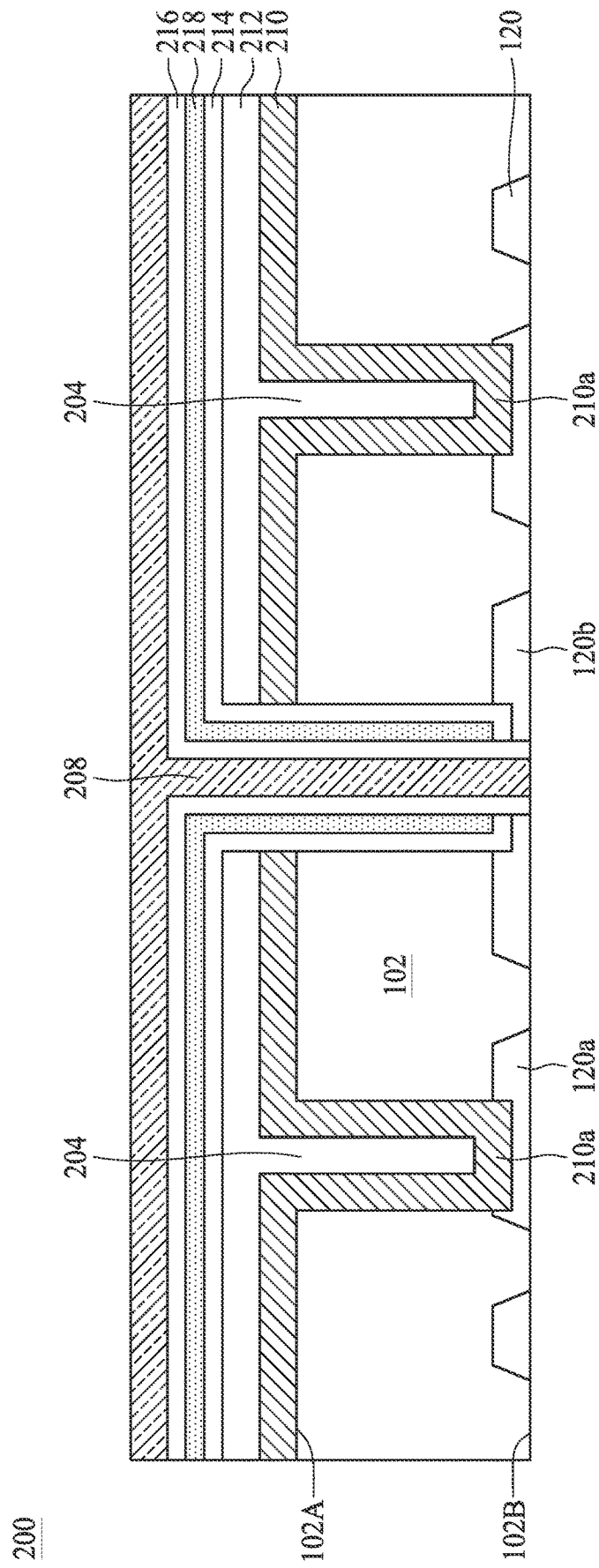
Figure 4J:
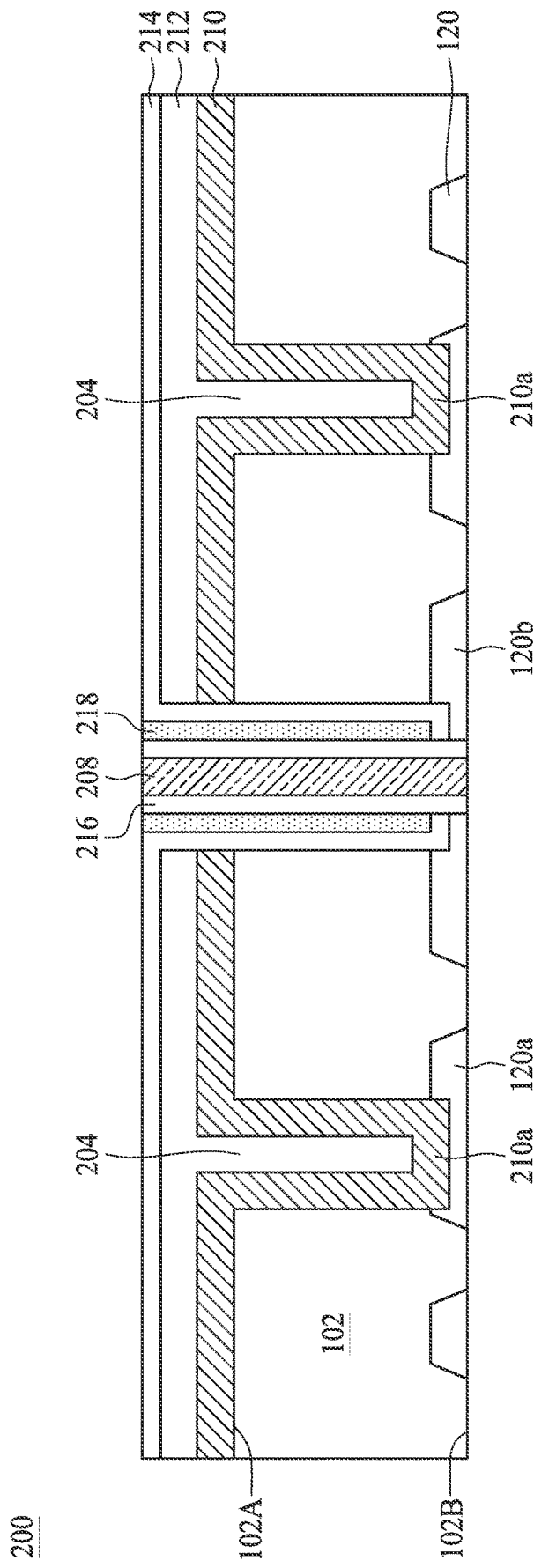
FIG. 4J illustrates a schematic drawing of the semiconductor structure according to some embodiments of the present disclosure.

Referring to FIGS. 4A to 4J, which are schematic drawings illustrating a semiconductor structure 200 at various fabrication stages according to aspects of the present disclosure in one or more embodiments. FIGS. 4A to 4I illustrate schematic drawings respectively of intermediate stages in the manufacturing of the semiconductor structure 200, in accordance with some embodiments. FIG. 4J illustrates a schematic drawing of the semiconductor structure 200 according to some embodiments. It should be noted that same elements in FIGS. 4A to 4J are indicated by the same numerals, and may include a same material. In some embodiments, the semiconductor structure 200 can be provided as shown in FIGS. 4A to 4J.

Referring to FIG. 4A, in operation 601, a substrate 102 is received. As described above, the substrate 102 includes a first surface 102A and a second surface 102B opposite to the first surface 102A. In some embodiments, the substrate 102 includes a plurality of shallow trench isolations (STIs) 120 (such as a first shallow trench isolation 120a and a second shallow trench isolation 120b) formed over the second surface 102B.

As shown in FIGS. 4A and 4B, an oxide material is formed on the first surface 102A of the substrate 102. The oxide material may include silicon oxide, but the disclosure is not limited thereto. In some embodiments, a deep trench 203 is formed in the substrate 102, where the deep trench 203 is formed by forming a first hard mask structure 201 over the first surface 102A of substrate 102, patterning the first hard mask structure 201 to form an opening 2010 (as shown in FIG. 4A) in the first hard mask structure 201, and etching the substrate 102 through the opening 2010 to form the deep trench 203, as shown in FIG. 4B, in accordance with some embodiments. The etching process stops over the first shallow trench isolation 120a. The first shallow trench isolation 120a is exposed from a bottom of the deep trench 203. After the deep trench 203 is formed, the first hard mask structure 201 is removed. Next, in FIG. 4C, a wet HF dip process is performed to remove the oxide material.

Referring to FIG. 4D, in operation 602, a first dielectric material is deposited over the first surface 102A of the substrate 102 and conformally formed in the deep trench 203. In some embodiments, the first dielectric material formed in the deep trench 203 covers a bottom and sidewalls of the deep trench 203. In some embodiments, the first dielectric material is a high-k dielectric material. As described above, the high-k dielectric material has a dielectric constant greater than that of silicon oxide ($k \approx 3.9$). The high-k dielectric material formed over the first surface 102A of the substrate 102 is referred as to a first dielectric layer 210, and the high-k dielectric material formed in the deep trench 203 is referred as to a sub dielectric layer 210a.

Still referring to FIG. 4D, in operation 604, a second dielectric material is deposited on the first dielectric layer 210, and on the sub dielectric layer 210a in the deep trench 203. The deep trench 203 is filled with the second dielectric material to form a deep trench isolation structure 204. The second dielectric material may include silicon oxide, but the disclosure is not limited thereto.

A planarization process such as a CMP process is then performed to remove a portion of the second dielectric material formed over the top surface of the first dielectric layer 210, leaving a second dielectric layer 212 over the first dielectric layer 210 and a flat and even surface of the second dielectric layer 212 is obtained, as shown in FIG. 4D, in accordance with some embodiments.

After the second dielectric layer 212 is formed, the following operations of forming the semiconductor structure 200 are similar to operation 605 to 610 of forming the semiconductor structure 100. In some embodiments, the process of forming the semiconductor structure 200, such as FIGS. 4E to 4J, may be similar as the process of forming the semiconductor structure 100 in FIGS. 3D to 3H; therefore, some details are omitted.

Referring to FIG. 4F, in operation 605, a via opening 207 is formed penetrating from a top surface of the second dielectric layer 212 to a top surface of the second shallow trench isolation 120b. In some embodiments, the via opening 207 is formed by forming a second hard mask structure 205 over the first surface 102A of substrate 102, patterning the second hard mask structure 205 to form an opening 205o (as shown in FIG. 4E) in the second hard mask structure 205, and etching substrate 102 through the opening 205o. The etching process stops over the second shallow trench isolation 120b. The second shallow trench isolation 120b is exposed from the via opening 207. The second hard mask structure 205 is then removed, as shown in FIG. 4F, in accordance with some embodiments.

Referring to FIG. 4G, in operation 606, a third dielectric layer 214 is formed over sidewalls of the via opening 207 and extending over the top surface of the second dielectric layer 212, and in operation 607, a fourth dielectric layer 218 is formed over the third dielectric layer 214. The third and fourth dielectric layer 214 and 218 are conformally formed in the via opening 207 and over the second dielectric layer 212. In such embodiments, the second shallow trench isolation 120b is covered by a bottom portion of the third dielectric layer 214. In FIG. 4H, in operation 608, the via opening 207 is deepened until the via opening 207 penetrating the second shallow trench isolation 120b. In such embodiments, the via opening 207 fully penetrates the substrate 102. The second shallow trench isolation 120b is exposed through a bottom of the via opening 207.

Referring to FIG. 4I, in operation 609, a barrier layer 216 is conformally formed in the via opening 207 and covers a bottom and sidewalls of the via opening 207, in accordance with some embodiments. In some embodiments, in operation 610, a metal material (such as copper) is formed over the barrier layer 216 to fill the via opening 207. A planarization process such as a CMP process is then performed to remove the excess portions of the metal material, thereby forming a through-substrate-via structure 208, as shown in FIG. 4J.

Accordingly, a semiconductor structure 200 is obtained. FIG. 4J illustrates a schematic drawing of the semiconductor structure 200 according to some embodiments. In some embodiments, the semiconductor structure 200 includes a substrate 102, a first and second shallow trench isolations 120a and 120b, a deep trench isolation structure 204, a first dielectric layer 210, a sub dielectric layer 210a, a second dielectric layer 212, a third dielectric layer 214 and a through substrate via structure 208. In some embodiments, the substrate 102 includes a first surface 102A and a second surface 102B opposite to the first surface 102A. In some embodiments, the first and second shallow trench isolations 120a and 120b are disposed in the substrate 102 and on the second surface 102B. In some embodiments, the deep trench isolation structure 204 is coupled to the first dielectric layer 210 and the sub dielectric layer 210a. In some embodiments, the sub dielectric layer 210a is disposed between sidewalls of the deep trench isolation structure 204 and the substrate 102, and between the deep trench isolation structure 204 and the first shallow trench isolation 120a. In some embodiments, the first dielectric layer 210 and the sub dielectric layer 210a include a high-k dielectric material. In some embodiments, the second dielectric layer 212 is disposed over the first dielectric layer 210 and coupled to the deep trench isolation structure 204. In some embodiments, a material of the deep trench isolation structure 204 is same with a material of the second dielectric layer 212. In some embodiments, the third dielectric layer 214 includes a horizontal portion disposed over the second dielectric layer 212 and a vertical portion coupled to the horizontal portion. In some embodiments, the through substrate via structure 208 penetrates the substrate 102 from the first surface 102A to the second surface 102B, and penetrates the second shallow trench isolation 120b. In some embodiments, the vertical portion of the third dielectric layer 214 surrounds the through substrate via structure 208.

In some embodiments, the semiconductor structure 200 also includes a barrier layer 216 and a fourth dielectric layer 218. In some embodiments, the barrier layer 216 is disposed on sidewalls of the through substrate via structure 208. In some embodiments, the barrier layer 216 is between the through substrate via structure 208 and the vertical portion of the third dielectric layer 214. In some embodiments, the fourth dielectric layer 218 is disposed between the barrier layer 216 and the vertical portion of the third dielectric layer 214. In some embodiments, the fourth dielectric layer 218, the barrier layer 216 and the vertical portion of the third dielectric layer 214 are parallel to each other. In some embodiments, a top surface of the horizontal portion of the third dielectric layer 214, a top surface of the fourth dielectric layer 218, a top surface of the barrier layer 216, and a top surface of the through substrate via structure 208 are aligned with each other. In some embodiments, a bottom surface of the barrier layer 216, a bottom surface of the through substrate via structure 208, and the second surface 102B are aligned with each other.

In some embodiments, a thickness of the first dielectric layer 210 including $HfO_2$ and a thickness of the sub dielectric layer 210a including $HfO_2$ are within a range from about 50 angstroms to about 100 angstroms. In some embodiments, a thickness of the first dielectric layer 210 including $Ta_2O_5$ and a thickness of the sub dielectric layer 210a including $Ta_2O_5$ are within a range from about 500 angstroms to about 800 angstroms. In some embodiments, a width of the through substrate via structure 208 is within a range from about 3.0 micrometer to about 3.5 micrometer. In some embodiments, a width of the deep trench isolation structure 204 is within a range from about 0.6 micrometer to about 0.8 micrometer.

Figure 5:
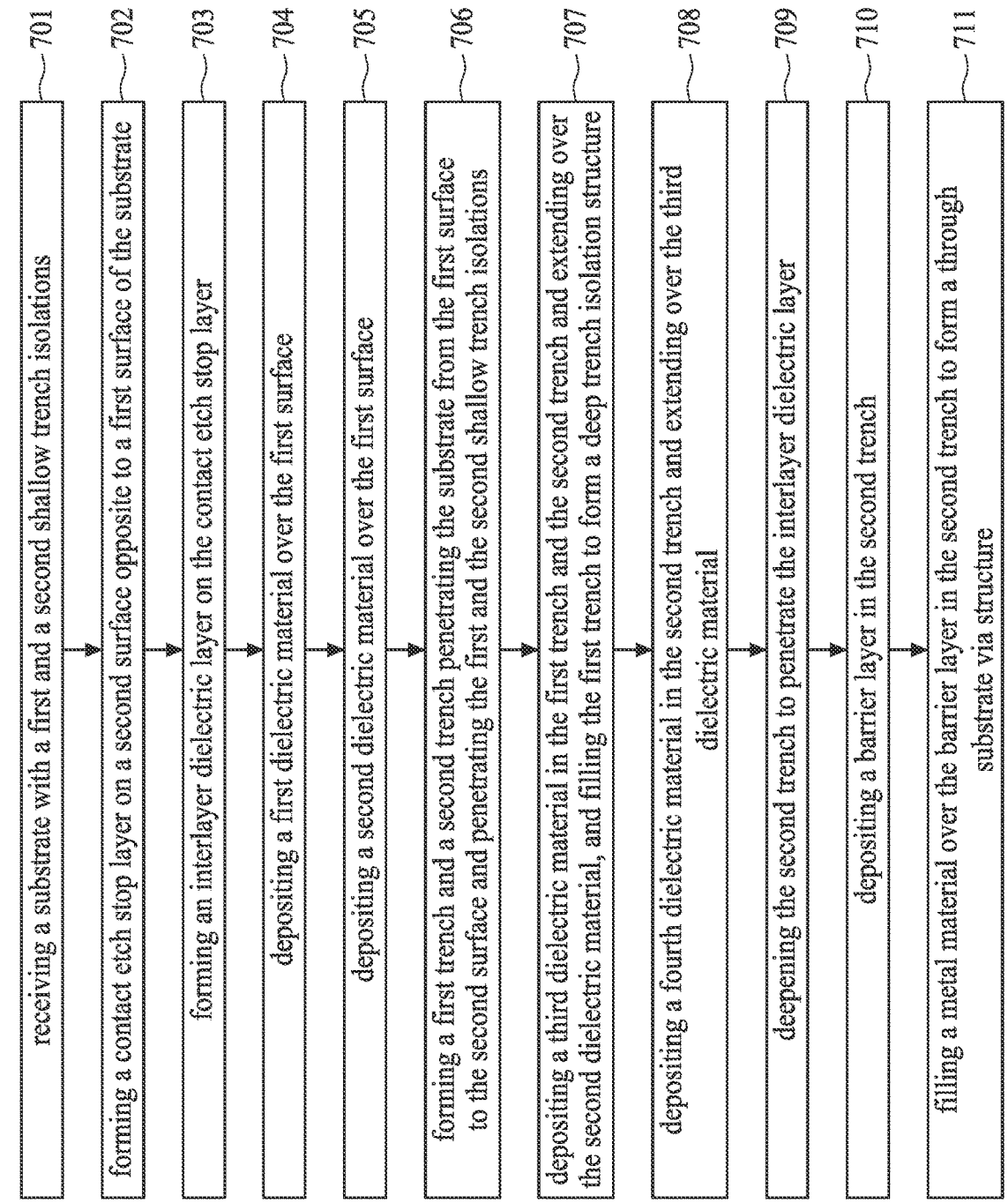
FIG. 5 is a flowchart of a method for forming a semiconductor structure according to some embodiments of the present disclosure.

FIG. 5 is a flowchart representing a method 700 for forming a semiconductor structure 300 according to some embodiments of the present disclosure. The method 700 includes a number of operations (701, 702, and 703 to 711). The method 700 will be further described according to one or more embodiments. It should be noted that the operations of the method 700 may be rearranged or otherwise modified within the scope of the various aspects. It should further be noted that additional processes may be provided before, during, and after the method 700, and that some other processes may be briefly described herein. Thus, other implementations are possible within the scope of the various aspects described herein.

In some embodiments, some operations of a semiconductor structure 300 may be similar to some operations of the semiconductor structure 100; therefore, the details are omitted.

Figure 6A:
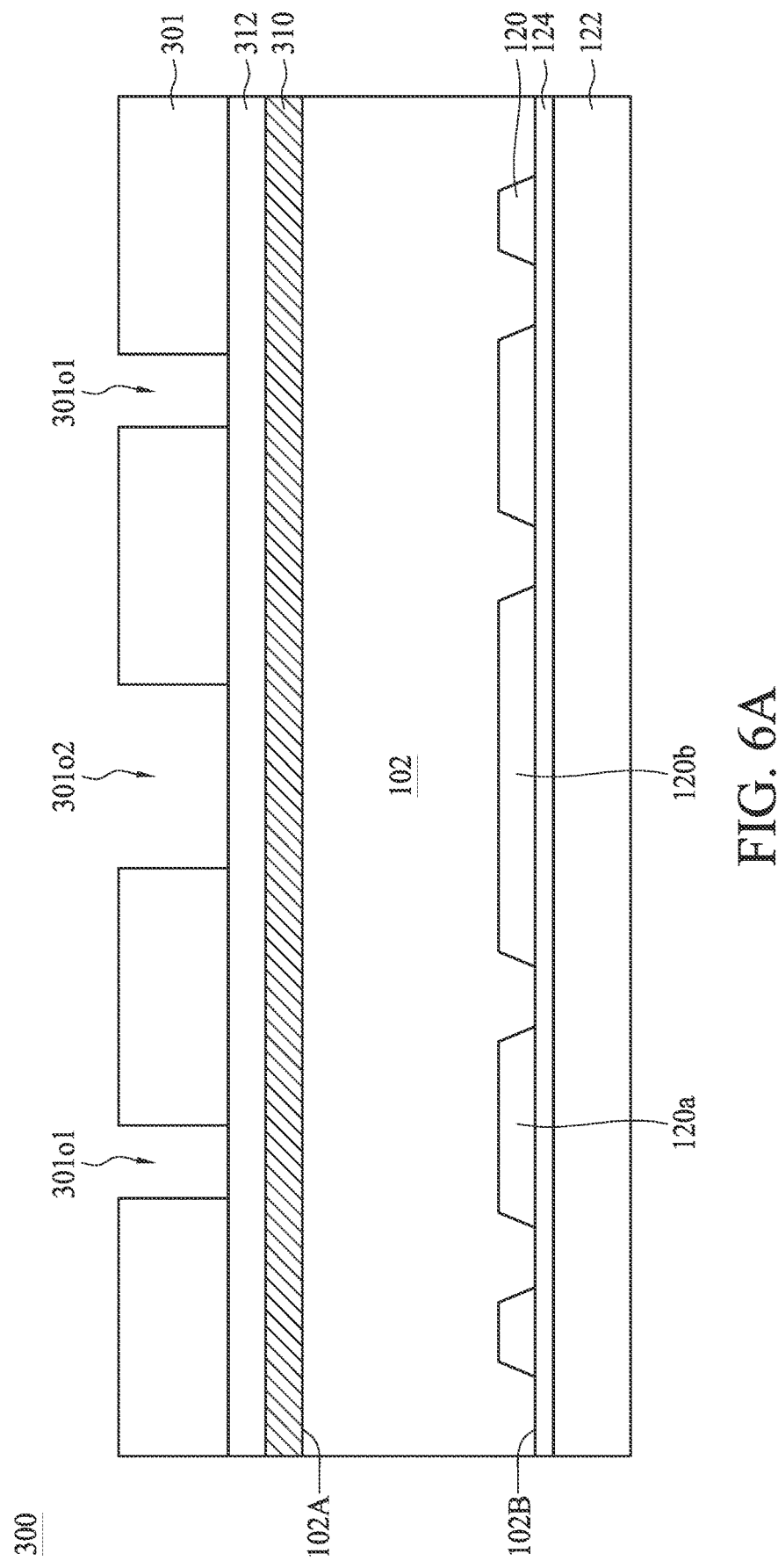
FIGS. 6A to 6E illustrate schematic drawings respectively of intermediate stages in the manufacturing of the semiconductor structure, in accordance with some embodiments.
Figure 6B:
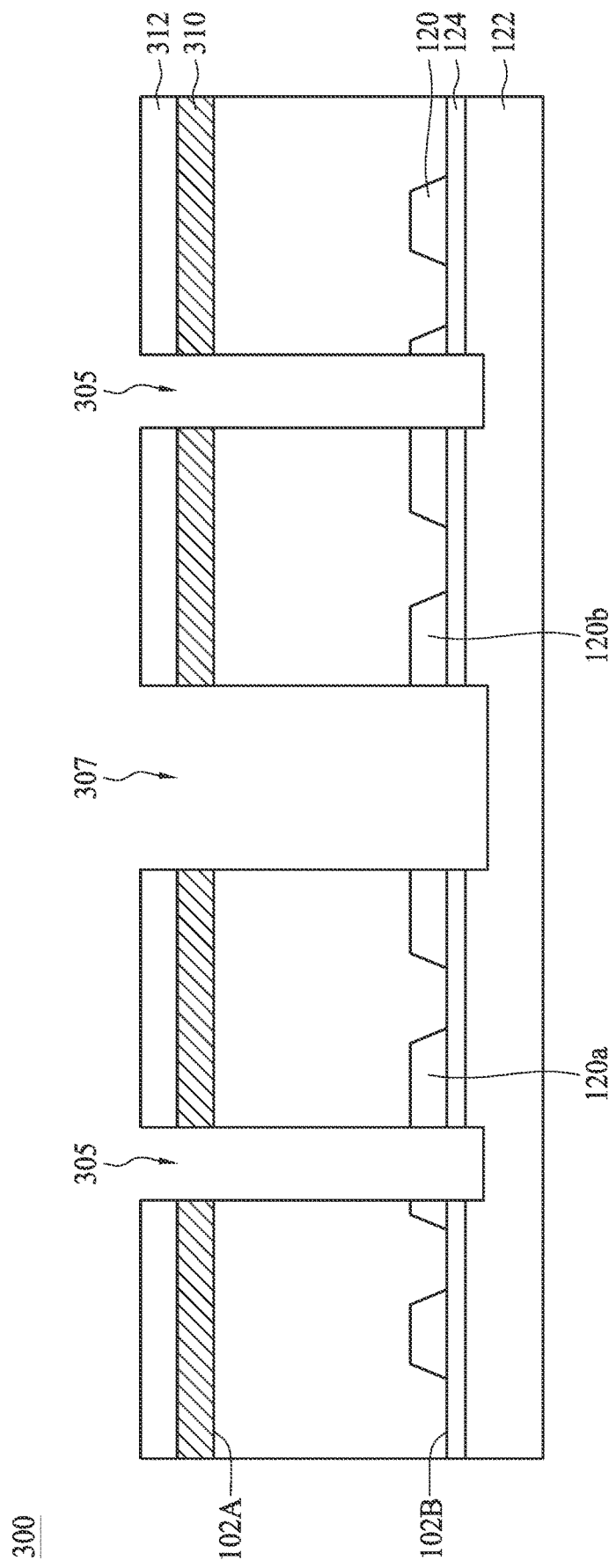
Figure 6C:
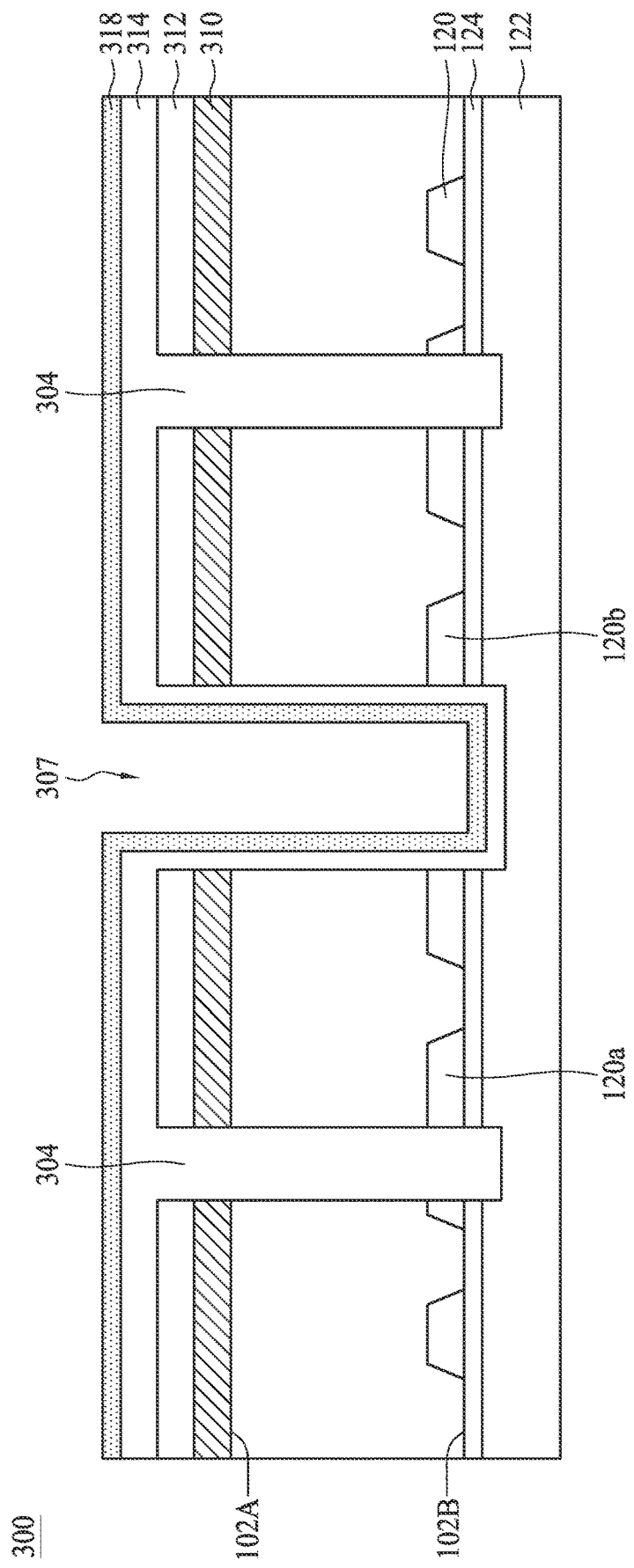
Figure 6D:
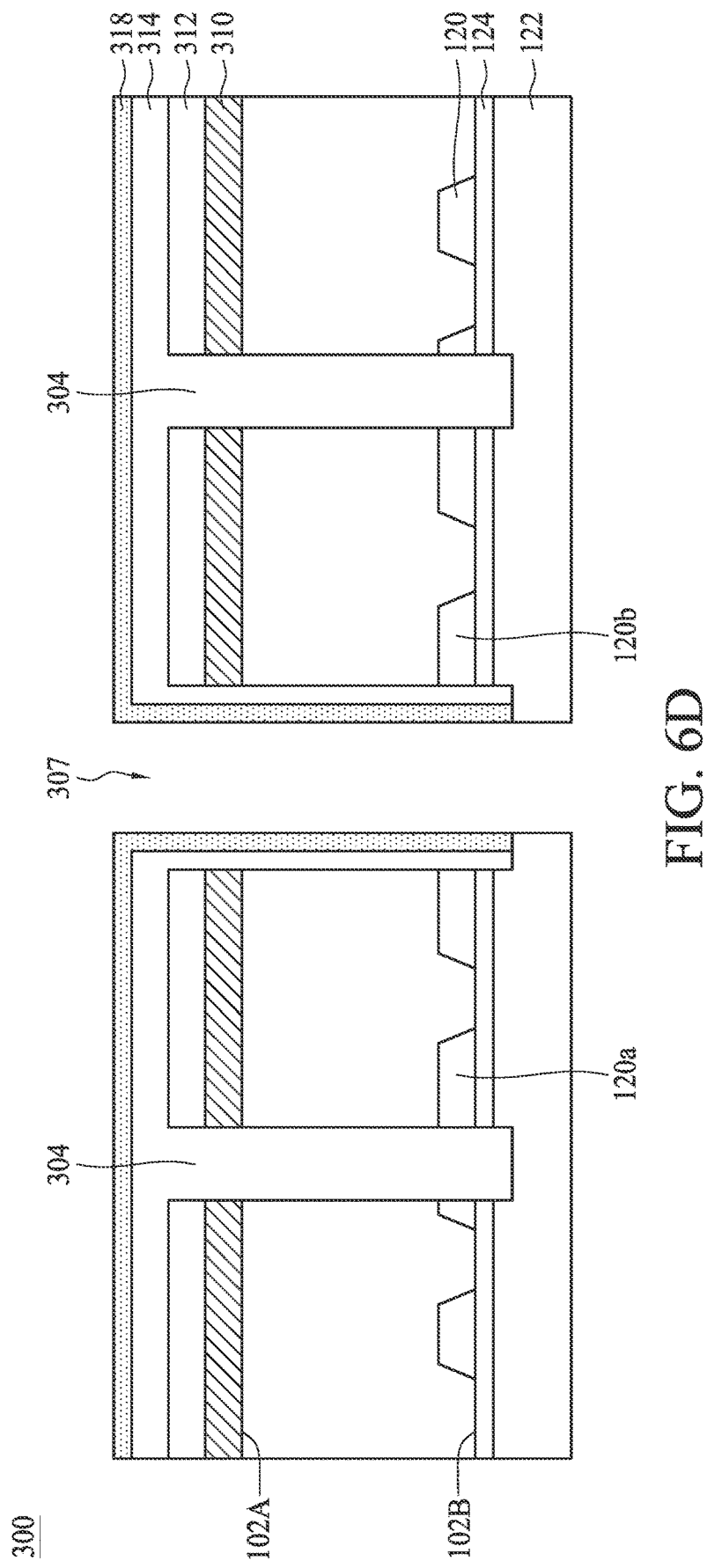
Figure 6E:
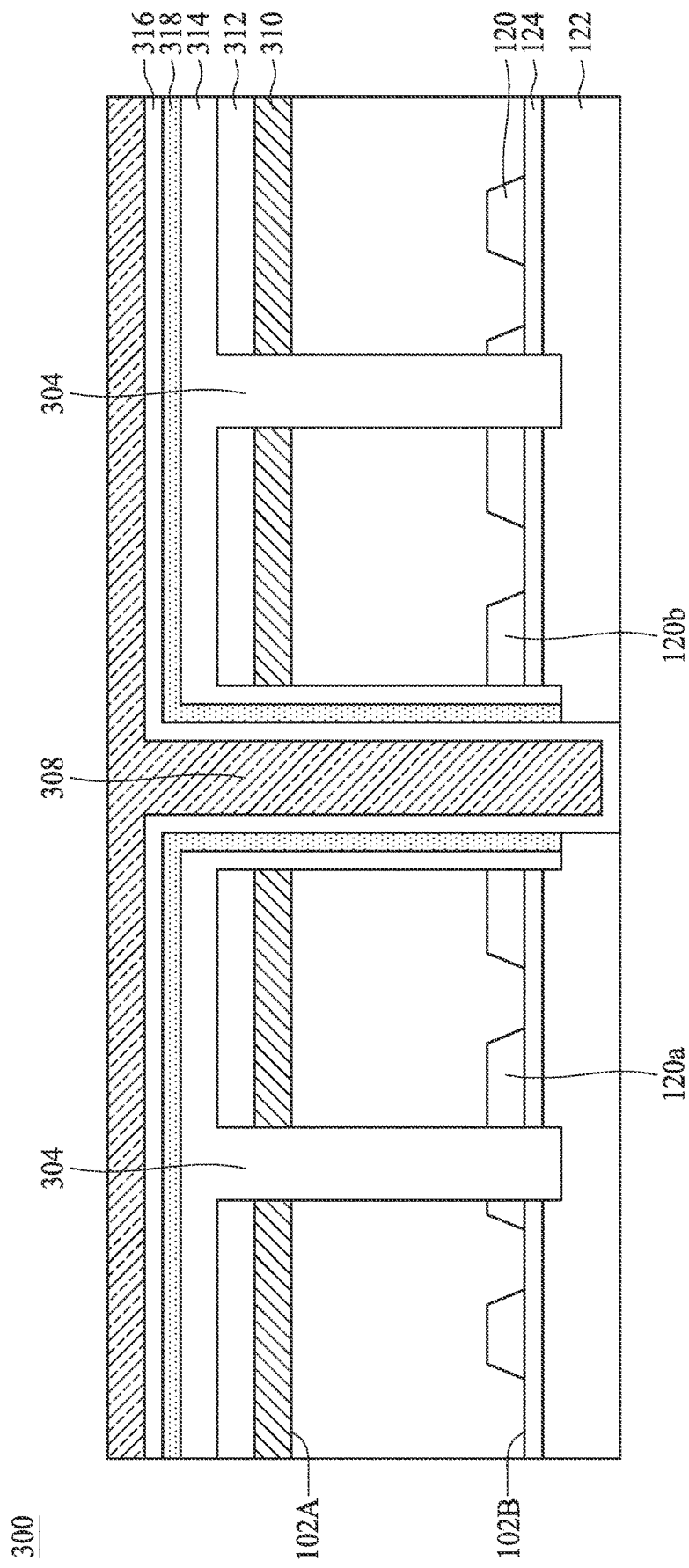
Figure 6F:
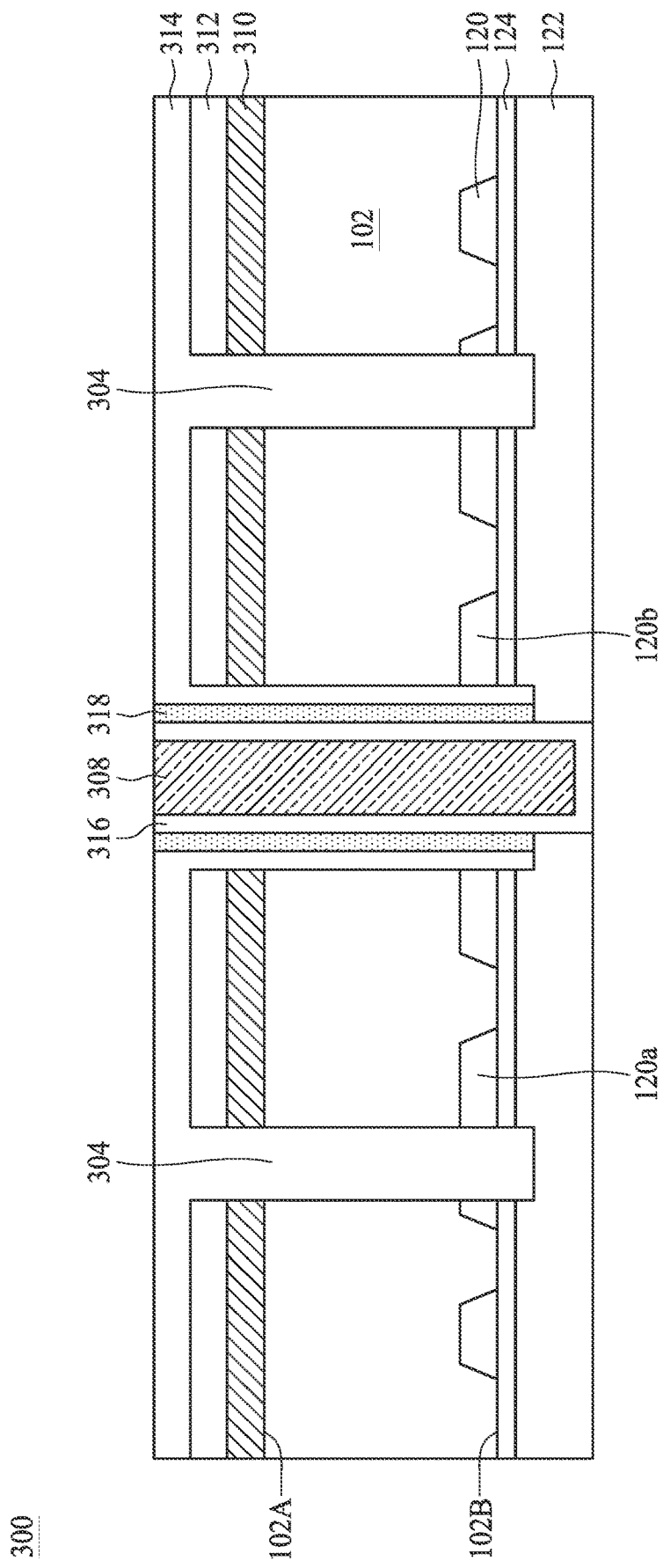
FIG. 6F illustrates a schematic drawing of the semiconductor structure according to some embodiments of the present disclosure.

Referring to FIGS. 6A to 6F, which are schematic drawings illustrating a semiconductor structure 300 at various fabrication stages according to aspects of the present disclosure in one or more embodiments. FIGS. 6A to 6E illustrate schematic drawings respectively of intermediate stages in the manufacturing of the semiconductor structure 300, in accordance with some embodiments. FIG. 6F illustrates a schematic drawing of the semiconductor structure 300 according to some embodiments. It should be noted that same elements in FIGS. 6A to 6F are indicated by the same numerals, and may include a same material. In some embodiments, the semiconductor structure 300 can be provided as shown in FIGS. 6A to 6F.

Referring to FIG. 6A, in operation 701, a substrate 102 is received. In some embodiments, the substrate 102 includes a first surface 102A and a second surface 102B opposite to the first surface 102A. In some embodiments, the substrate 102 includes a plurality of shallow trench isolations (STIs) 120 (such as a first shallow trench isolation 120a and a second shallow trench isolation 120b) formed over the second surface 102B. In operation 702, an etch stop layer such as a contact etch stop layer (CESL) 124 is formed on the second surface 102B. In some embodiments, the CESL 124 may include a dielectric material, such as, silicon nitride, silicon oxide, silicon oxynitride, or the like. In operation 703, an interlayer dielectric (ILD) layer 122 is formed on the CESL 124. The ILD layer 122 may include a dielectric material including, for example, silicon oxide, silicon nitride, silicon oxynitride, TEOS formed oxide, PSG, BPSG, low-k dielectric material, another suitable dielectric material, or combinations thereof. In some embodiments, the dielectric material of the CESL 124 has a lower etch rate than the dielectric material of the overlying ILD layer 122.

Still referring to FIG. 6A, in operation 704, a first dielectric layer 310 is formed over the first surface 102A of the substrate 102, where the first dielectric layer 310 includes a high-k dielectric material. In operation 705, a second dielectric layer 312 is formed over the first dielectric layer 310.

Referring to FIGS. 6A and 6B, in operation 706, a first trench 305 and a second trench 307 are formed by forming a hard mask structure 301 over the first surface 102A of the substrate 102, patterning the hard mask structure 301 to form a first opening 301o1 and a second opening 301o2 (as shown in FIG. 6A) in the hard mask structure 301, and etching the substrate 102 through the first opening 301o1 and the second opening 301o2 to form the first trench 305 and the second trench 307, as shown in FIG. 6B, in accordance with some embodiments. The first trench 305 and the second trench 307 penetrate the substrate 102, the first and second shallow trench isolations 120a and 120b, and the CESL 124, and stops over the ILD layer 122. The ILD layer 122 is exposed from a bottom of the first trench 305 and a bottom of the second trench 307. After the first trench 305 and the second trench 307 are formed, the hard mask structure 301 is removed.

Referring to FIG. 6C, in operation 707, a third dielectric material is deposited in the first trench 305 and the second trench 307 and extending over the second dielectric layer 312. Further, the first trench 305 is filled with the third dielectric material to form a deep trench isolation structure 304. In operation 708, a fourth dielectric material is deposited in the second trench 307 and extending over the third dielectric material. The third and fourth dielectric material are conformally formed in the second trench 307 and over the second dielectric layer 312.

Referring to FIG. 6D, a portion of the third dielectric material and a portion of the fourth dielectric material are removed, such to form a third dielectric layer 314 over sidewalls and a bottom of the second trench 307, and a fourth dielectric layer 318 over the third dielectric layer 314. In some embodiments, the ILD layer 122 may be exposed through the bottom of the second trench 307. In some embodiments, in operation 709, the second trench 307 is deepened until the second trench 307 fully penetrating the ILD layer 122, as shown in FIG. 6D.

Referring to FIG. 6E, in operation 710, a barrier layer 316 is conformally formed in the second trench 307 and covers a bottom and sidewalls of the second trench 307, in accordance with some embodiments. In some embodiments, in operation 711, a metal material (such as copper) is formed over the barrier layer 316 to fill the second trench 307. A planarization process such as a CMP process is then performed to remove the excess portions of the metal material, thereby forming a through-substrate-via structure 308, as shown in FIG. 6F.

Accordingly, a semiconductor structure 300 is obtained. FIG. 6F illustrates a schematic drawing of the semiconductor structure 300 according to some embodiments. In some embodiments, the semiconductor structure 300 includes a substrate 102, a first and second shallow trench isolations 120a and 120b, a CESL 124, a ILD layer 122, a deep trench isolation structure 304, a first dielectric layer 310, a second dielectric layer 312, a third dielectric layer 314, and a through substrate via structure 308. In some embodiments, the substrate 102 includes a first surface 102A and a second surface 102B opposite to the first surface 102A. In some embodiments, the first and second shallow trench isolations 120a and 120b are disposed in the substrate 102 and on the second surface 102B. In some embodiments, the ILD layer 122 underlies the second surface 102B of the substrate 102, and the CESL 124 is between the ILD layer 122 and the substrate 102.

In some embodiments, the deep trench isolation structure 304 is coupled to the first shallow trench isolation 120a, the CESL 124 and the ILD layer 122. In some embodiments, the first dielectric layer 310 is disposed on the first surface 102A and coupled to the deep trench isolation structure 304. In some embodiments, the first dielectric layer 310 is a high-k dielectric material. In some embodiments, the second dielectric layer 312 is disposed over the first dielectric layer 310 and coupled to the deep trench isolation structure 304. In some embodiments, the third dielectric layer 314 includes a horizontal portion disposed over the second dielectric layer 312 and a vertical portion coupled to the horizontal portion. In some embodiments, the through substrate via structure 308 penetrates the substrate 102 from the first surface 102A to the second surface 102B and penetrates the second shallow trench isolation 120b and the CESL 124. In some embodiments, the vertical portion of the third dielectric layer 314 surrounds the through substrate via structure 108.

In some embodiments, the semiconductor structure 300 also includes a barrier layer 316 and a fourth dielectric layer 318. In some embodiments, the barrier layer 316 is disposed between the through substrate via structure 308 and the vertical portion of the third dielectric layer 314. In some embodiments, the fourth dielectric layer 318 is disposed between the barrier layer 316 and the vertical portion of the third dielectric layer 314. In some embodiments, the fourth dielectric layer 318, the barrier layer 316 and the vertical portion of the third dielectric layer 314 are parallel to each other. In some embodiments, a top surface of the horizontal portion of the third dielectric layer 314, a top surface of the fourth dielectric layer 318, a top surface of the barrier layer 316, and a top surface of the through substrate via structure 108 are aligned with each other. In some embodiments, the deep trench isolation structure 304 is coupled to the third dielectric layer 314 and the ILD layer 122. In some embodiments, a bottom surface of the barrier layer 316 and a bottom surface of the ILD layer 122 are aligned with each other.

In some embodiments, a thickness of the first dielectric layer 310 including $HfO_2$ is within a range from about 50 angstroms to about 100 angstroms. In some embodiments, a thickness of the first dielectric layer 310 including $Ta_2O_5$ is within a range from about 500 angstroms to about 800 angstroms. In some embodiments, a width of the through substrate via structure 308 is within a range from about 3.0 micrometer to about 3.5 micrometer. In some embodiments, a width of the deep trench isolation structure 304 is within a range from about 0.6 micrometer to about 0.8 micrometer.

Figure 7A:
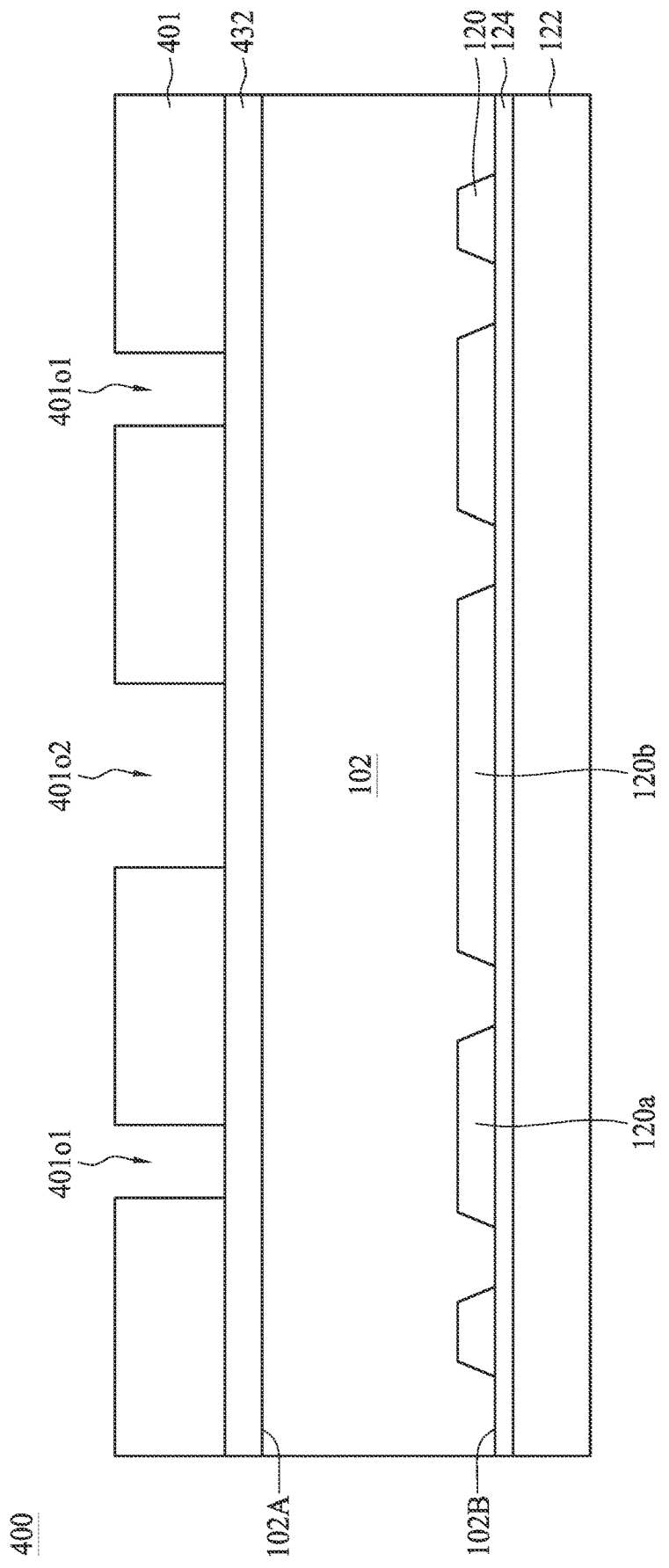
FIGS. 7A to 7F illustrate schematic drawings respectively of intermediate stages in the manufacturing of the semiconductor structure, in accordance with some embodiments.
Figure 7B:
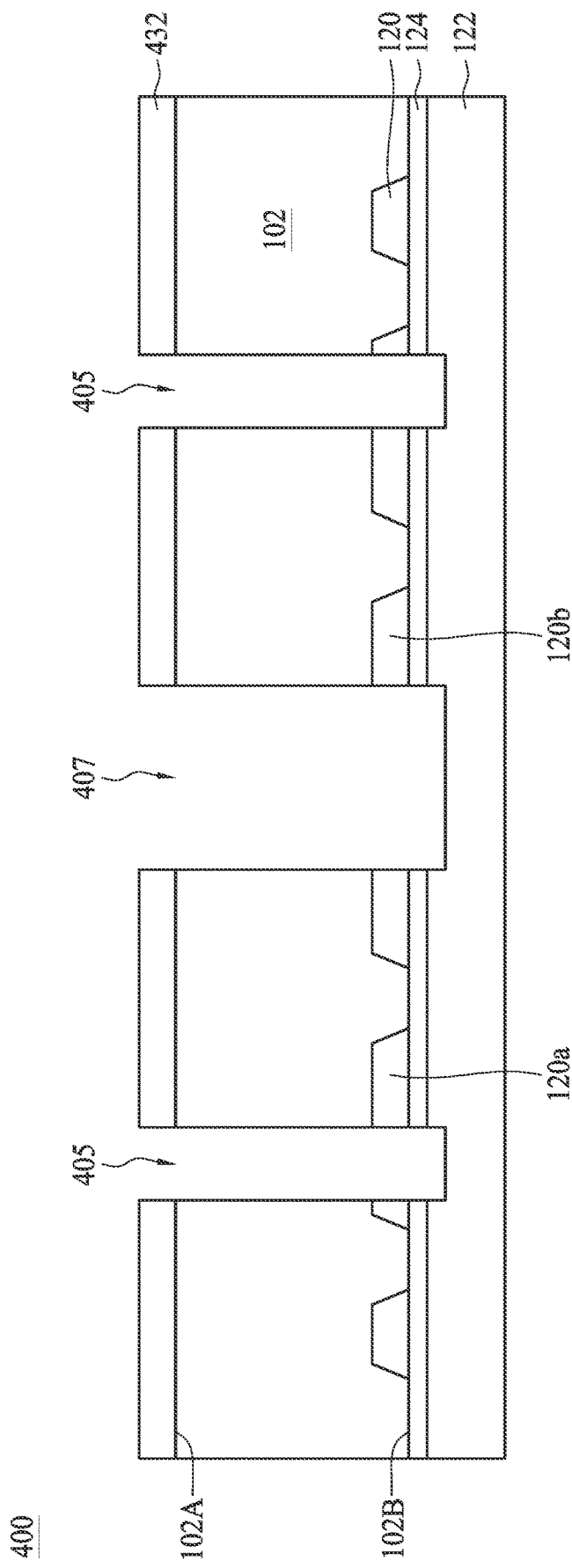
Figure 7C:
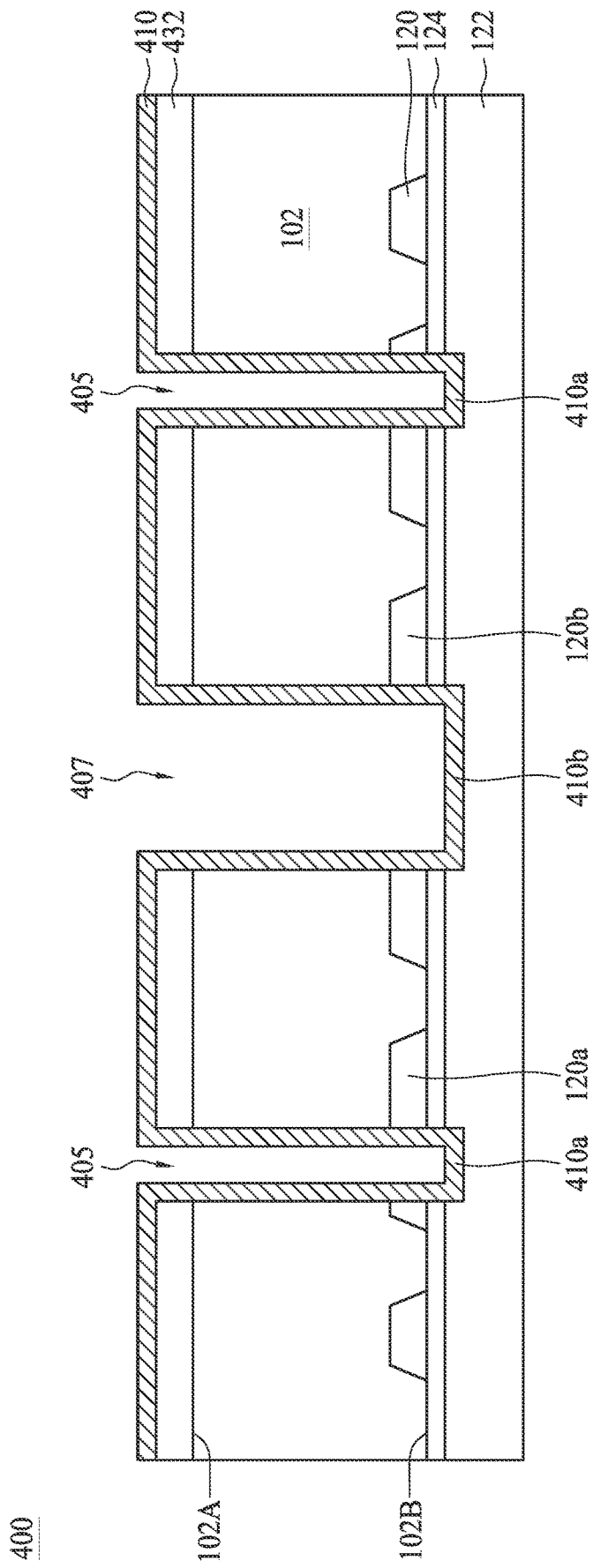
Figure 7D:
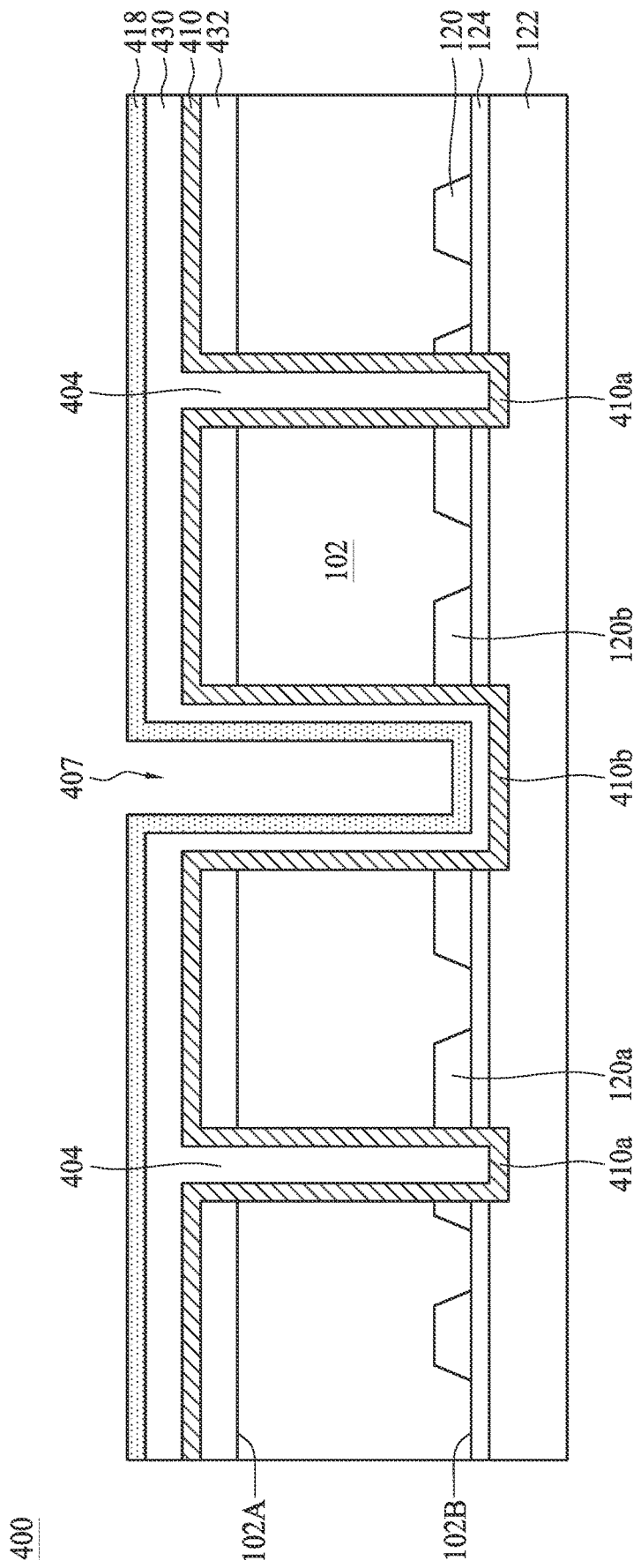
Figure 7E:
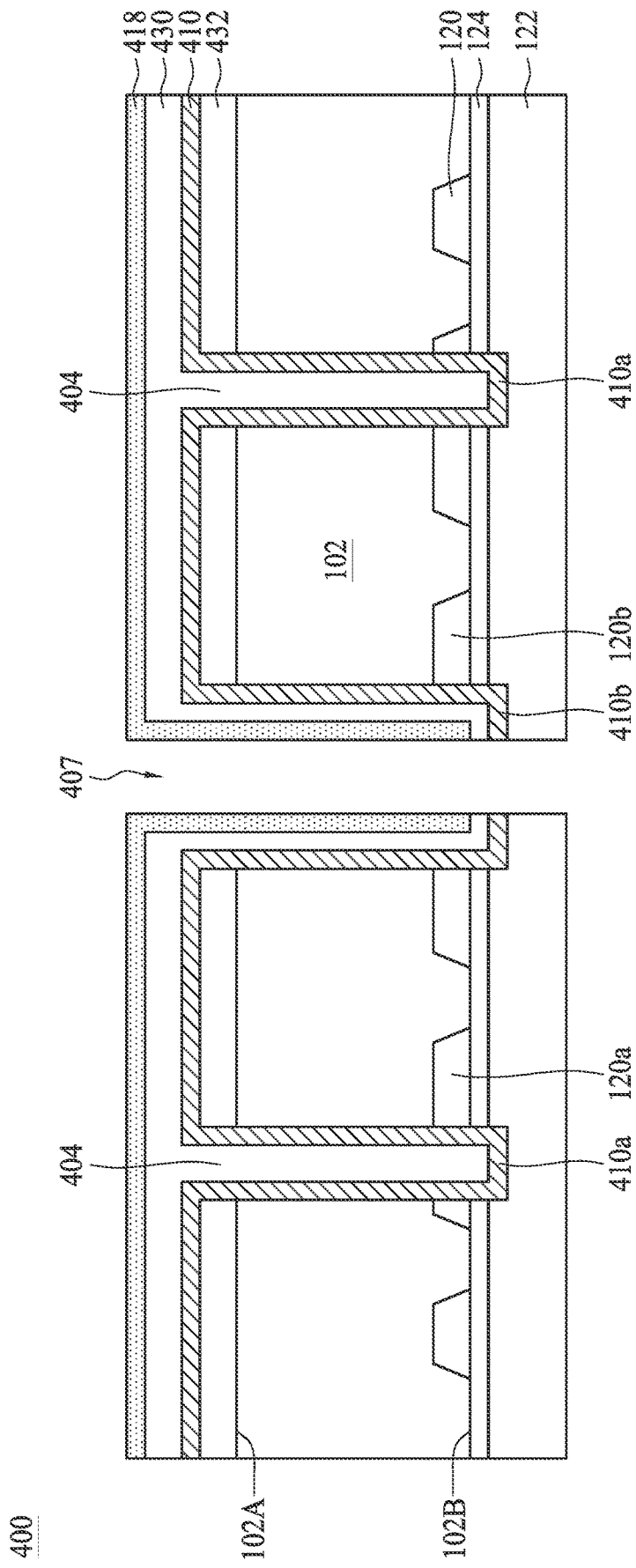
Figure 7F:
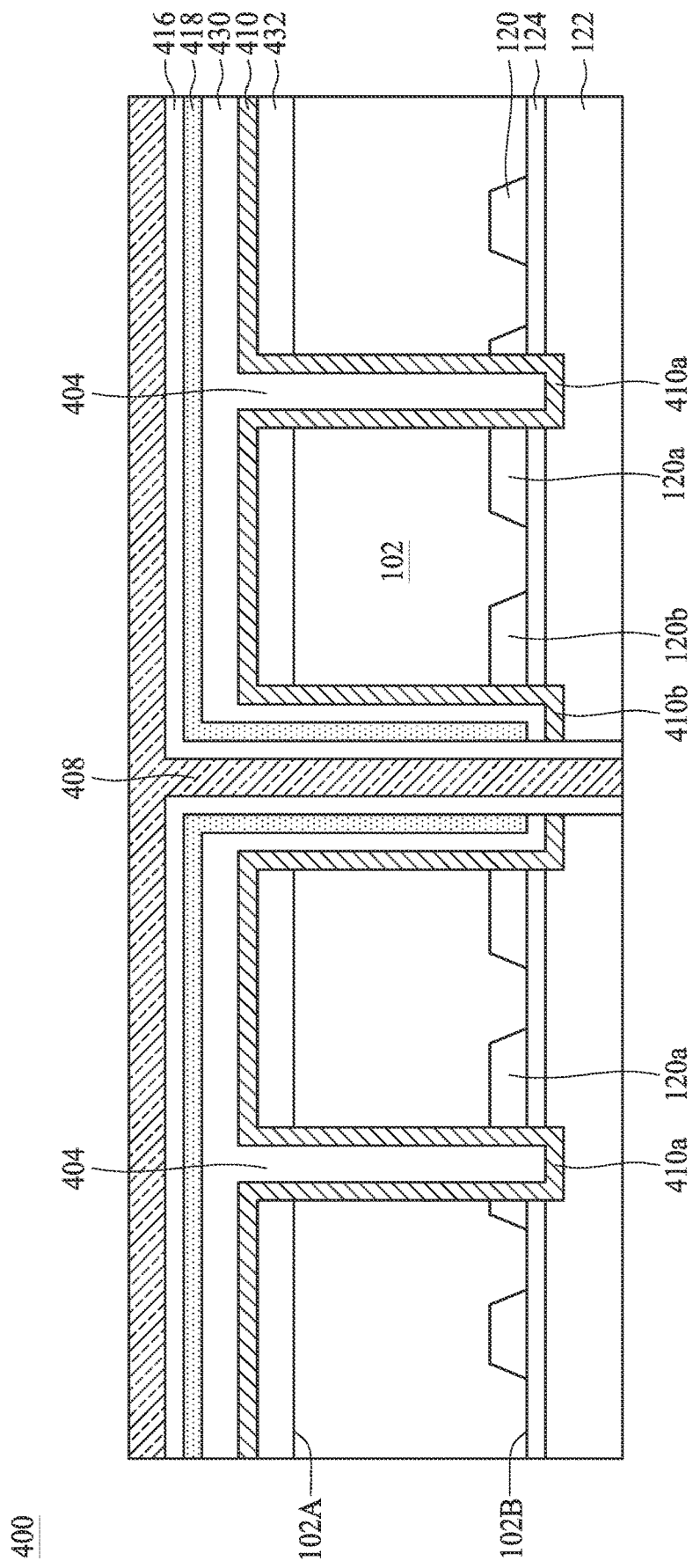
Figure 7G:
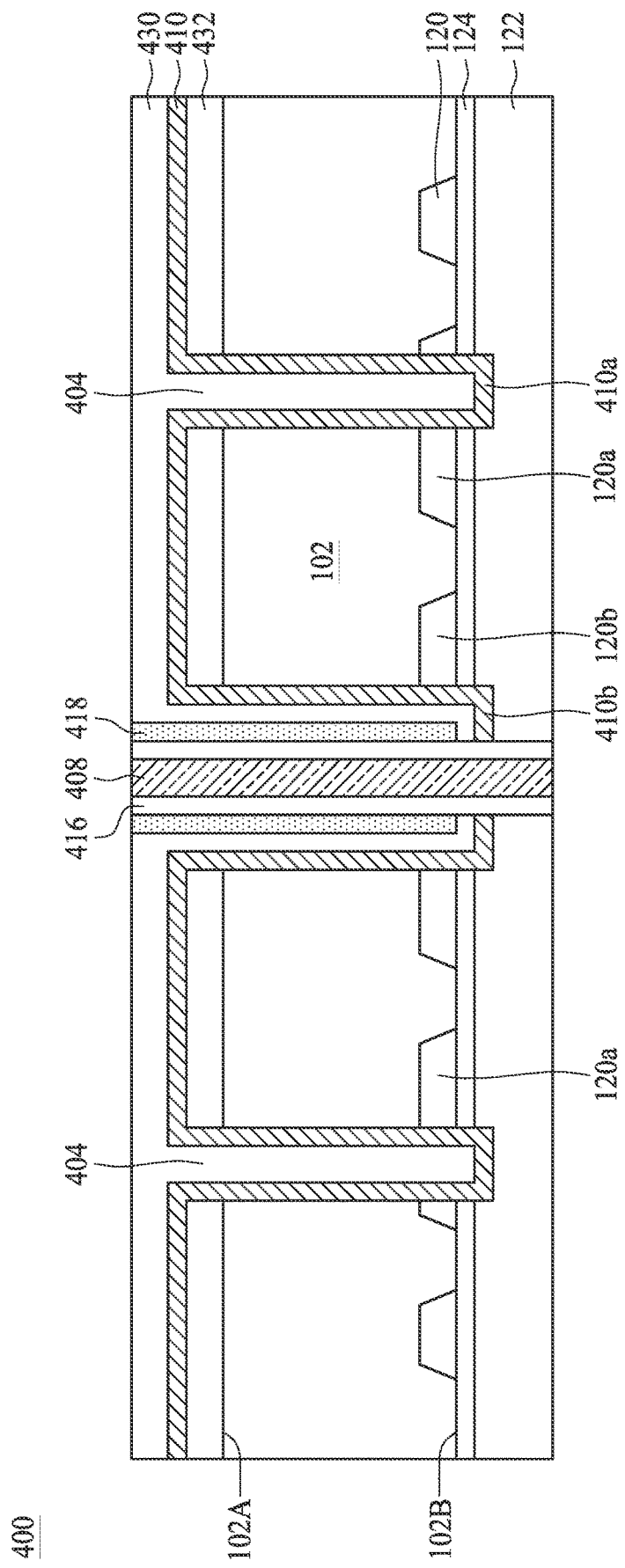
FIG. 7G illustrates a schematic drawing of the semiconductor structure according to some embodiments of the present disclosure.

Referring to FIGS. 7A to 7G, which are schematic drawings illustrating a semiconductor structure 400 at various fabrication stages according to aspects of the present disclosure in one or more embodiments. FIGS. 7A to 7F illustrate schematic drawings respectively of intermediate stages in the manufacturing of the semiconductor structure 400, in accordance with some embodiments. FIG. 7G illustrates a schematic drawing of the semiconductor structure 400 according to some embodiments. It should be noted that same elements in FIGS. 7A to 7G are indicated by the same numerals, and may include a same material. In some embodiments, the semiconductor structure 400 can be provided as shown in FIGS. 7A to 7G.

In some embodiments, some operations of a semiconductor structure 400 may be similar to some operations of the semiconductor structure 300; therefore, the details are omitted.

Referring to FIG. 7A, in operation 701, a substrate 102 is received. As described above, the substrate 102 includes a first surface 102A and a second surface 102B opposite to the first surface 102A. In some embodiments, the substrate 102 includes a plurality of shallow trench isolations (STIs) 120 (such as a first shallow trench isolation 120a and a second shallow trench isolation 120b) formed over the second surface 102B. In operation 702, an etch stop layer such as a CESL 124 is formed on the second surface 102B. In operation 703, an ILD layer 122 is formed on the CESL 124. As shown in FIG. 7A, in operation 704, a first dielectric layer 432 is formed over the first surface 102A of the substrate 102. The first dielectric layer 432 may include silicon oxide, but the disclosure is not limited thereto.

Referring to FIGS. 7A and 7B, in operation 706, a first trench 405 and a second trench 407 are formed by forming a hard mask structure 401 over the first surface 102A of the substrate 102, patterning the hard mask structure 401 to form a first opening 401o1 and a second opening 401o2 (as shown in FIG. 7A) in the hard mask structure 401, and etching the substrate 102 through the first opening 401o1 and the second opening 401o2 to form the first trench 405 and the second trench 407, as shown in FIG. 7B, in accordance with some embodiments. The first trench 405 and the second trench 407 penetrate the substrate 102, the first and second shallow trench isolations 120a and 120b, and the CESL 124, and stops over the ILD layer 122. The ILD layer 122 is exposed from a bottom of the first trench 405 and a bottom of the second trench 407. After the first trench 405 and the second trench 407 are formed, the hard mask structure 401 is removed.

Referring to FIG. 7C, in operation 705, a second dielectric material is deposited over the first dielectric layer 432 and conformally formed in the first trench 405 and the second trench 407. In some embodiments, the second dielectric material formed in the first trench 405 covers the bottom and sidewalls of the first trench 405, and the second dielectric material formed in the second trench 407 covers the bottom and sidewalls of the second trench 407. In some embodiments, the second dielectric material is a high-k dielectric material. The high-k dielectric material formed over the first surface 102A of the substrate 102 is referred as to a second dielectric layer 410, the high-k dielectric material formed in the first trench 405 is referred as to a first sub dielectric layer 410a, and the high-k dielectric material formed in the second trench 407 is referred as to a second sub dielectric layer 410b.

Referring to FIG. 7D, in operation 707, a third dielectric material is deposited in the first trench 405 and the second trench 407 and extending over the second dielectric layer 410. Further, the third dielectric material fills the first trench 405 to form a deep trench isolation structure 404. Also, the third dielectric material is conformally deposited in the second trench 407. Next, in some embodiments, in operation 708, a fourth dielectric material is deposited in the second trench 407 and extending over the third dielectric material. The third and fourth dielectric material are conformally formed in the second trench 407 and over the second dielectric layer 410.

Referring to FIG. 7E, a portion of the third dielectric material and a portion of the fourth dielectric material are removed, such to form a third dielectric layer 430 over sidewalls and the bottom of the second trench 407, and a fourth dielectric layer 418 over the third dielectric layer 430. In some embodiments, the ILD layer 122 may be exposed through the bottom of the second trench 407. In some embodiments, in operation 709, the second trench 407 is deepened until the second trench 407 fully penetrating the ILD layer 122, as shown in FIG. 7E.

Referring to FIG. 7F, in operation 710, a barrier layer 416 is formed in the second trench 407 and covers sidewalls of the second trench 407, in accordance with some embodiments. In some embodiments, in operation 711, a metal material (such as copper) is formed over the barrier layer 416 to fill the second trench 407. A planarization process such as a CMP process is then performed to remove the excess portions of the metal material, thereby forming a through-substrate-via structure 408, as shown in FIG. 7G.

Accordingly, a semiconductor structure 400 is obtained. FIG. 7G illustrates a schematic drawing of the semiconductor structure 400 according to some embodiments. In some embodiments, the semiconductor structure 400 includes a substrate 102, a first and second shallow trench isolations 120a and 120b, a CESL 124, a ILD layer 122, a deep trench isolation structure 404, a first dielectric layer 432, a second dielectric layer 410, a first sub dielectric layer 410a, a second sub dielectric layer 410b, a third dielectric layer 430, a fourth dielectric layer 418, and a through substrate via structure 408. In some embodiments, the substrate 102 includes the first surface 102A and the second surface 102B opposite to the first surface 102A. In some embodiments, the first and second shallow trench isolations 120a and 120b are disposed in the substrate 102 and on the second surface 102B. In some embodiments, the ILD layer 122 underlies the second surface 102B of the substrate 102, and the CESL 124 is between the ILD layer 122 and the substrate 102.

In some embodiments, the deep trench isolation structure 404 is coupled to the second dielectric layer 410 and the first sub dielectric layer 410a. In some embodiments, the second dielectric layer 410 is disposed over the first surface 102A and coupled to the first sub dielectric layer 410a and the second sub dielectric layer 410b. In some embodiments, the second dielectric layer 410, the first sub dielectric layer 410a and the second sub dielectric layer 410b include a high-k dielectric material. In some embodiments, the third dielectric layer 430 is disposed over the second dielectric layer 410 and coupled to the deep trench isolation structure 404. In some embodiments, the third dielectric layer 430 includes a horizontal portion disposed over the second dielectric layer 410 and a vertical portion coupled to the horizontal portion. In some embodiments, the through substrate via structure 408 penetrates the substrate 102, the second shallow trench isolation 120b, the CESL 124 and the ILD layer 122. In some embodiments, the vertical portion of the third dielectric layer 430 surrounds the through substrate via structure 408.

In some embodiments, the semiconductor structure 400 also includes a barrier layer 416 disposed between the through substrate via structure 408 and the vertical portion of the third dielectric layer 430. In some embodiments, the fourth dielectric layer 418 is disposed between the barrier layer 416 and the vertical portion of the third dielectric layer 430. In some embodiments, the through substrate via structure 408, the fourth dielectric layer 418, the barrier layer 416, and the vertical portion of the third dielectric layer 430 are parallel to each other. In some embodiments, a top surface of the horizontal portion of the third dielectric layer 430, a top surface of the fourth dielectric layer 418, a top surface of the barrier layer 416, and a top surface of the through substrate via structure 408 are aligned with each other. In some embodiments, a bottom surface of the barrier layer 416, a bottom surface of the ILD layer 122 and a bottom surface of the through substrate via structure 408 are aligned with each other.

In some embodiments, a thickness of the second dielectric layer 410 (or the first sub dielectric layer 410a or the second sub dielectric layer 410b) including $HfO_2$ is within a range from about 50 angstroms to about 100 angstroms. In some embodiments, a thickness of the second dielectric layer 410 (or the first sub dielectric layer 410a or the second sub dielectric layer 410b) including $Ta_2O_5$ is within a range from about 500 angstroms to about 800 angstroms. In some embodiments, a width of the through substrate via structure 408 is within a range from about 3.0 micrometer to about 3.5 micrometer. In some embodiments, a width of the deep trench isolation structure 404 is within a range from about 0.6 micrometer to about 0.8 micrometer.

In some embodiments, the present disclosure provides semiconductor structures and methods for forming the same to reduce a substrate leakage. In some embodiments, a HK film is used to form in the deep trench or in the through substrate via, such that the substrate leakage of the semiconductor structure can be mitigated. In some embodiments, the semiconductor structure including the HK film can be formed in the back side substrate. In some embodiments, the semiconductor structure including the HK film can be the isolation layer to reduce the substrate leakage.

As described in greater detail above, some implementations described herein provide a semiconductor structure includes semiconductor structure includes a substrate with a first surface and a second surface opposite to the first surface, a first and a second shallow trench isolations disposed in the substrate and on the second surface, a deep trench isolation structure in the substrate and coupled to the first shallow trench isolation, a first dielectric layer disposed on the first surface and coupled to the deep trench isolation structure, a second dielectric layer disposed over the first dielectric layer and coupled to the deep trench isolation structure, a third dielectric layer comprising a horizontal portion disposed over the second dielectric layer and a vertical portion coupled to the horizontal portion, and a through substrate via structure penetrating the substrate from the first surface to the second surface and penetrating the second shallow trench isolation. In some embodiments, the vertical portion of the third dielectric layer surrounds the through substrate via structure.

As described in greater detail above, some implementations described herein provide a method of forming a semiconductor structure. In some embodiments, the method includes receiving a substrate comprising a first and a second shallow trench isolations disposed on a second surface opposite to a first surface of the substrate, depositing a first dielectric material over the first surface, forming a deep trench in the substrate, depositing a second dielectric material over the first dielectric material and filling the deep trench to form a deep trench isolation structure, forming a via opening penetrating from a top surface of the second dielectric material to a top surface of the second shallow trench isolation, depositing a third dielectric material in the via opening and extending over the top surface of the second dielectric material, depositing a fourth dielectric material in the via opening and extending over the third dielectric material, deepening the via opening to penetrate the second shallow trench isolation, depositing a barrier layer in the via opening, and filling a metal material over the barrier layer in the via opening to form a through substrate via structure.

As described in greater detail above, some implementations described herein provide a method of forming a semiconductor structure In some embodiments, the method includes receiving a substrate comprising a first and a second shallow trench isolation, forming a contact etch stop layer on a second surface opposite to a first surface of the substrate, forming an interlayer dielectric layer on the contact etch stop layer, depositing a first dielectric material over the first surface, depositing a second dielectric material over the first surface, forming a first trench and a second trench penetrating the substrate from the first surface to the second surface and penetrating the first and the second shallow trench isolations, depositing a third dielectric material in the first trench and the second trench and extending over the first dielectric material, and filling the first trench to form a deep trench isolation structure, depositing a fourth dielectric material in the second trench and extending over the third dielectric material, deepening the second trench to penetrate the interlayer dielectric layer, depositing a barrier layer in the second trench, and filling a metal material over the barrier layer in the second trench to form a through substrate via structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate comprising a first surface and a second surface opposite to the first surface;
   a first and a second shallow trench isolations disposed in the substrate and on the second surface;
   a deep trench isolation structure in the substrate and coupled to the first shallow trench isolation;
   a first dielectric layer disposed on the first surface and coupled to the deep trench isolation structure;
   a second dielectric layer disposed over the first dielectric layer and coupled to the deep trench isolation structure;
   a third dielectric layer comprising a horizontal portion disposed over the second dielectric layer and a vertical portion coupled to the horizontal portion; and a through substrate via structure penetrating the substrate from the first surface to the second surface and penetrating the second shallow trench isolation, wherein the vertical portion of the third dielectric layer surrounds the through substrate via structure.

2. The semiconductor structure of claim 1, wherein the first dielectric layer comprises a high-k dielectric material.

3. The semiconductor structure of claim 1, further comprising:
   a barrier layer disposed between the through substrate via structure and the vertical portion of the third dielectric layer; and
   a fourth dielectric layer disposed between the barrier layer and the vertical portion of the third dielectric layer,
   wherein the fourth dielectric layer, the barrier layer and the vertical portion of the third dielectric layer are parallel to each other.

4. The semiconductor structure of claim 3, wherein a top surface of the horizontal portion of the third dielectric layer, a top surface of the fourth dielectric layer, a top surface of the barrier layer, and a top surface of the through substrate via structure are aligned with each other.

5. The semiconductor structure of claim 1, further comprising:
   a sub dielectric layer of the first dielectric layer disposed between sidewalls of the deep trench isolation structure and the substrate, and between the deep trench isolation structure and the first shallow trench isolation; and
   a barrier layer disposed on sidewalls of the through substrate via structure, wherein a bottom surface of the barrier layer, a bottom surface of the through substrate via structure, and the second surface are aligned with each other.

6. The semiconductor structure of claim 5, wherein a material of the deep trench isolation structure is same with a material of the second dielectric layer.

7. The semiconductor structure of claim 1, further comprising
   an interlayer dielectric layer underlying the second surface of the substrate; and
   a contact etch stop layer between the interlayer dielectric layer and the substrate, wherein the through substrate via structure penetrates the contact etch stop layer.

8. The semiconductor structure of claim 7, wherein the deep trench isolation structure is coupled to the third dielectric layer and the interlayer dielectric layer.

9. The semiconductor structure of claim 1, the first dielectric layer further comprising:
   a first sub dielectric layer disposed between sidewalls of the deep trench isolation structure and the substrate, and between the deep trench isolation structure and an interlayer dielectric layer; and
   a second sub dielectric layer disposed between sidewalls of the through substrate via structure and the substrate, and between the through substrate via structure and the second shallow trench isolation.

10. The semiconductor structure of claim 9, further comprising:
    a barrier layer disposed on the sidewalls of the through substrate via structure, wherein the barrier layer is between the through substrate via structure and the interlayer dielectric layer; and
    a fifth dielectric layer over the first surface, wherein the fifth dielectric layer is between the first surface and the first dielectric layer.

11. A method of forming a semiconductor structure, comprising:
    receiving a substrate comprising a first and a second shallow trench isolations disposed on a second surface opposite to a first surface of the substrate;
    depositing a first dielectric material over the first surface;
    forming a deep trench in the substrate;
    depositing a second dielectric material over the first dielectric material and filling the deep trench to form a deep trench isolation structure;
    forming a via opening penetrating from a top surface of the second dielectric material to a top surface of the second shallow trench isolation;
    depositing a third dielectric material in the via opening and extending over the top surface of the second dielectric material;
    depositing a fourth dielectric material in the via opening and extending over the third dielectric material;
    deepening the via opening to penetrate the second shallow trench isolation;
    depositing a barrier layer in the via opening; and
    filling a metal material over the barrier layer in the via opening to form a through substrate via structure.

12. The method of claim 11, wherein a material of the first dielectric material is a high-k dielectric material.

13. The method of claim 11, wherein a top surface of the third dielectric material, a top surface of the fourth dielectric material, a top surface of the barrier layer, and a top surface of the through substrate via structure are aligned with each other.

14. The method of claim 11, wherein the first dielectric material is further conformally formed in the deep trench and covers a bottom and sidewalls of the deep trench.

15. The method of claim 14, wherein a bottom surface of the barrier layer, a bottom surface of the through substrate via structure, and the second surface are aligned with each other.

16. A method of forming a semiconductor structure, comprising:
    receiving a substrate comprising a first and a second shallow trench isolation;
    forming a contact etch stop layer on a second surface opposite to a first surface of the substrate;
    forming an interlayer dielectric layer on the contact etch stop layer;
    depositing a first dielectric material over the first surface;
    depositing a second dielectric material over the first surface;
    forming a first trench and a second trench penetrating the substrate from the first surface to the second surface and penetrating the first and the second shallow trench isolations;
    depositing a third dielectric material in the first trench and the second trench and extending over the first dielectric material, and filling the first trench to form a deep trench isolation structure;
    depositing a fourth dielectric material in the second trench and extending over the third dielectric material;
    deepening the second trench to penetrate the interlayer dielectric layer;
    depositing a barrier layer in the second trench; and
    filling a metal material over the barrier layer in the second trench to form a through substrate via structure.

17. The method of claim 16, wherein the second dielectric material is further conformally formed in the first trench and the second trench, and covers a bottom and sidewalls of the first trench and a bottom and sidewalls of the second trench.

18. The method of claim 17, wherein a material of the second dielectric material is a high-k dielectric material.

19. The method of claim 16, wherein a top surface of the third dielectric material, a top surface of the fourth dielectric material, a top surface of the barrier layer, and a top surface of the through substrate via structure are aligned with each other.

20. The method of claim 16, wherein a bottom surface of the barrier layer and a bottom surface of the interlayer dielectric layer are aligned with each other.

* * * * *